United States Patent
Fukukaza

(10) Patent No.: US 7,619,474 B2
(45) Date of Patent: Nov. 17, 2009

(54) ANALOG CIRCUIT, ELECTRONIC INSTRUMENT, AND OPERATIONAL AMPLIFIER

(75) Inventor: Akihiro Fukukaza, Hino (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 11/979,820

(22) Filed: Nov. 8, 2007

(65) Prior Publication Data

US 2008/0111627 A1 May 15, 2008

(30) Foreign Application Priority Data

Nov. 10, 2006 (JP) .............................. 2006-305153

(51) Int. Cl.
*H03F 3/45* (2006.01)
(52) U.S. Cl. ..................................... 330/253
(58) Field of Classification Search .............. 330/253, 330/255; 455/249.1
See application file for complete search history.

(56) References Cited

U.S. PATENT DOCUMENTS

| | | | |
|---|---|---|---|
| 5,130,666 A | 7/1992 | Nicollini | |
| 2004/0196936 A1 | 10/2004 | Kawama et al. | |
| 2008/0280578 A1* | 11/2008 | Nimura | 455/249.1 |

FOREIGN PATENT DOCUMENTS

| | | |
|---|---|---|
| JP | A 03-226620 | 10/1991 |
| JP | A-4-217106 | 8/1992 |
| JP | A-2004-312074 | 11/2004 |

OTHER PUBLICATIONS

Pending Fukuzawa, Akihiro; Filed Nov. 8, 2007 U.S. Appl. No. 11/979,764.
Pending Fukuzawa, Akihiro; Filed Nov. 8,2007 U.S. Appl. No. 11/979,814.
Pending Fukuzawa, Akihiro; Filed Nov. 8, 2007 U.S. Appl. No. 11/979,824.
U.S. Appl. No. 11/803,167, filed May 11, 2007.

* cited by examiner

*Primary Examiner*—Steven J Mottola
(74) *Attorney, Agent, or Firm*—Oliff & Berridge, PLC

(57) ABSTRACT

An analog circuit includes a first circuit including a first-type operational amplifier of which a frequency of an amplification target signal is a first frequency, and a second circuit including a second-type operational amplifier of which a frequency of an amplification target signal is a second frequency lower than the first frequency. When a channel width and a channel length of a differential-stage transistor of a differential section of the first-type operational amplifier are respectively referred to as $W1a$ and $L1a$, a bias current flowing through the differential section is referred to as $Ia$, a channel width and a channel length of a differential-stage transistor of a differential section of the second-type operational amplifier are respectively referred to as $W1b$ and $L1b$, and a bias current flowing through the differential section is referred to as $Ib$, $W1b \times L1b > W1a \times L1a$ and $Ia > Ib$ are satisfied.

20 Claims, 21 Drawing Sheets

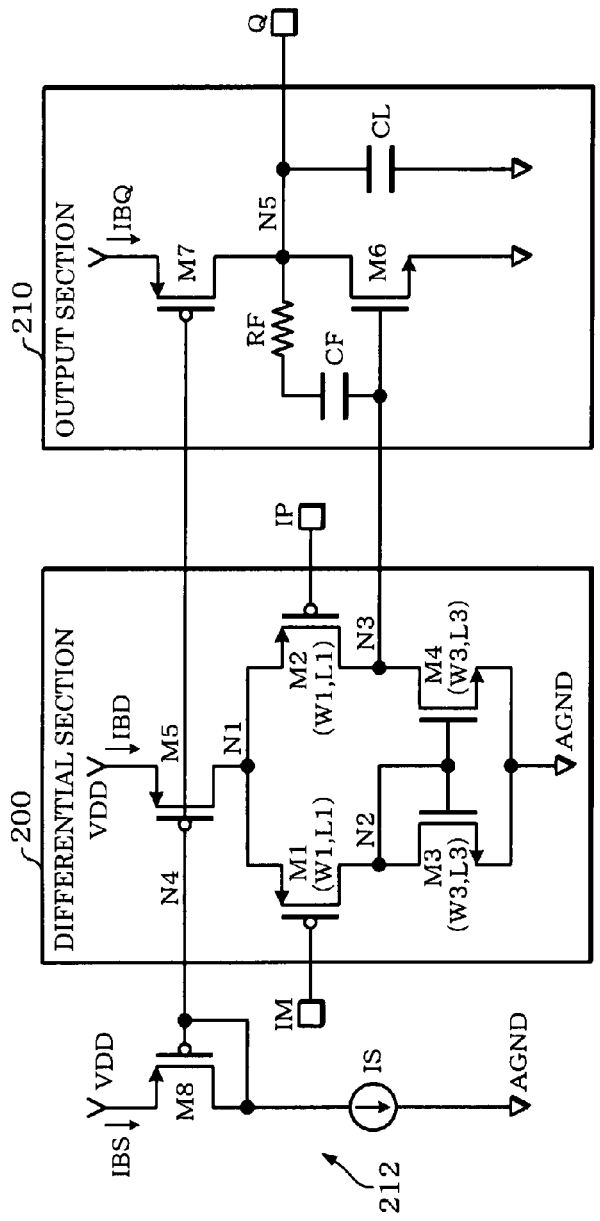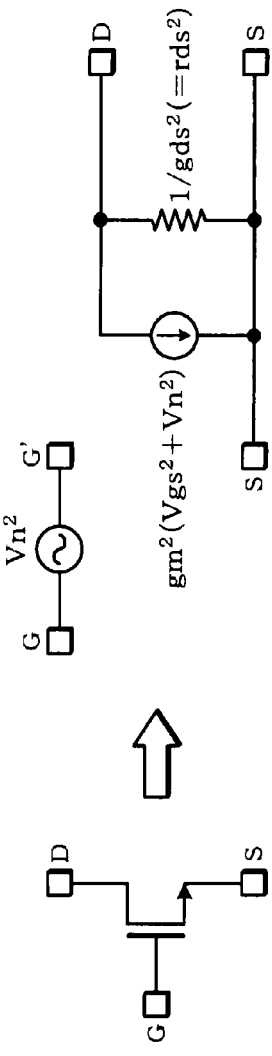
FIG. 4A
FIG. 4B

FIG. 5A

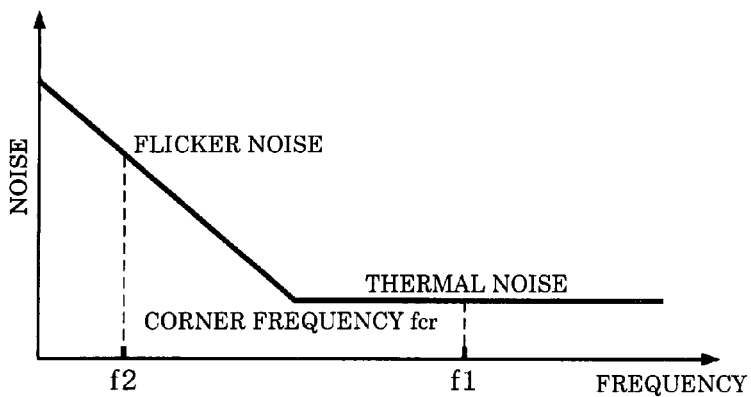

FIG. 5B

| FIRST-TYPE OPERATIONAL AMPLIFIER OP1 | SECOND-TYPE OPERATIONAL AMPLIFIER OP2 | THIRD-TYPE OPERATIONAL AMPLIFIER OP3 |
|---|---|---|
| $W1 \times L1 = W1a \times L1a$<br>$IBD = Ia$<br>$fop = f1$<br><br>$RT1 = RT1a = W1a/L1a$<br>$RT3 = RT3a = W3a/L3a$ | $W1 \times L1 = W1b \times L1b$<br>$IBD = Ib$<br>$fop = f2$<br><br>$L1/L3 = L1b/L3b$ | $W1 \times L1 = W1c \times L1c$<br>$IBD = Ic$ |

FIG. 5C

| | OP1 (THERMAL NOISE REDUCTION) | OP2 (FLICKER NOISE REDUCTION) | OP3 |
|---|---|---|---|
| $W1 \times L1$ | SMALL ($W1a \times L1a$) | LARGE ($W1b \times L1b$) | LARGE ($W1c \times L1c$) |
| IBD | LARGE (Ia) | SMALL (Ib) | LARGE (Ic) |
| fop | HIGH (f1) | LOW (f2) | |
| L1/L3 | | SMALL (L1b<L3b) | |
| RT1/RT3 | LARGE (RT1a>RT3a) | | |

$W1b \times L1b > W1a \times L1a$  $\qquad$  $W1c \times L1c > W1a \times L1a$
$Ia > Ib$  $\qquad\qquad\qquad\qquad\qquad$  $Ic > Ib$ FIG. 6A
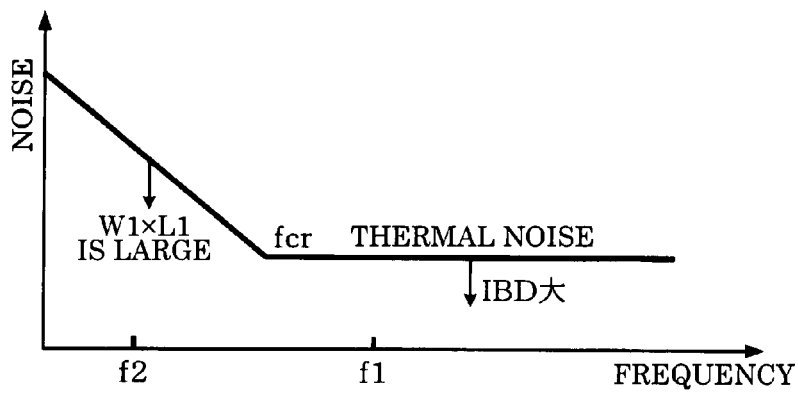
FIG. 6B  FIRST-TYPE OPERATIONAL AMPLIFIER OP1
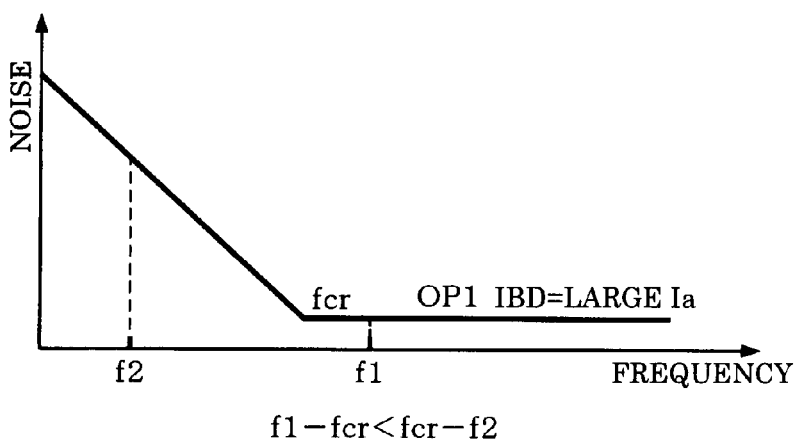
FIG. 6C  SECOND-TYPE OPERATIONAL AMPLIFIER OP2
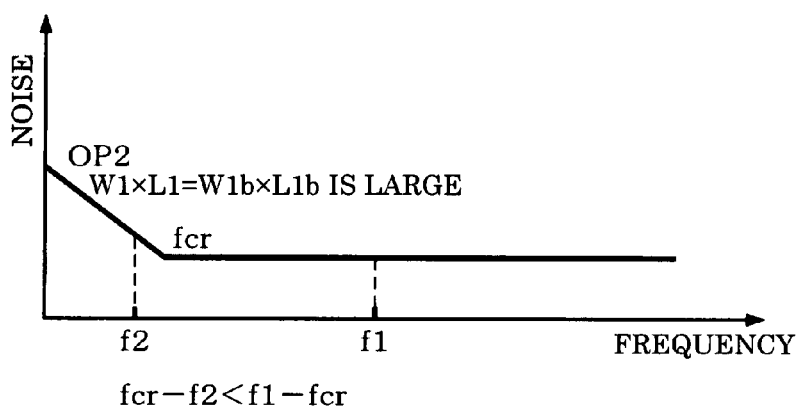

FIG. 7A  FIRST-TYPE OPERATIONAL AMPLIFIER OP1
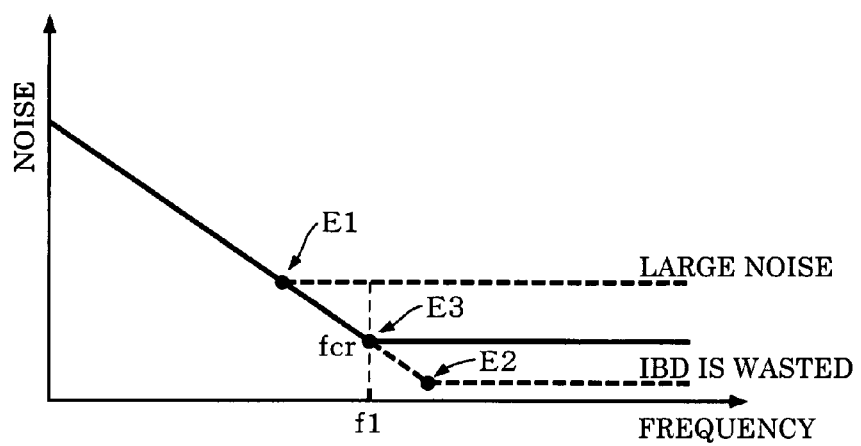
FIG. 7B  SECOND-TYPE OPERATIONAL AMPLIFIER OP2
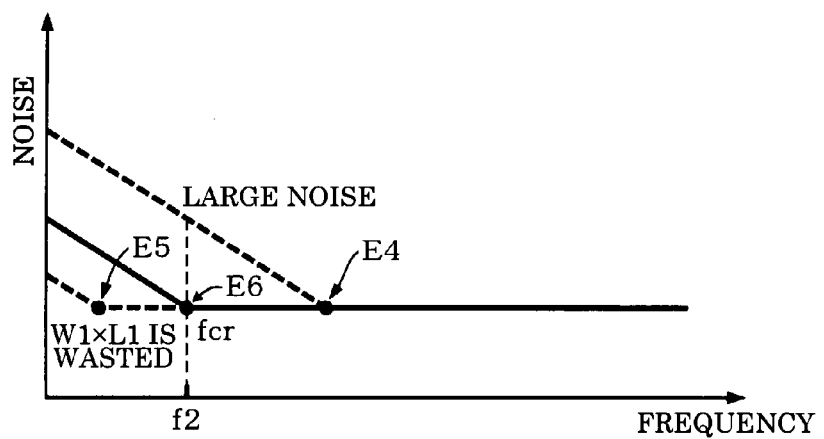

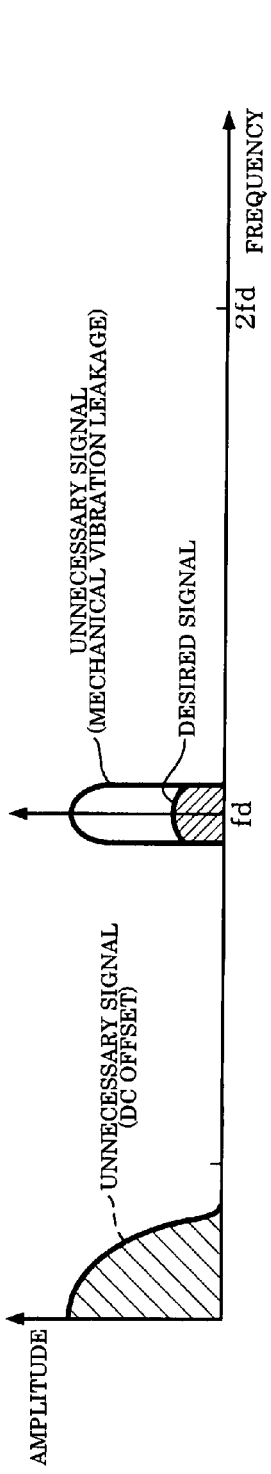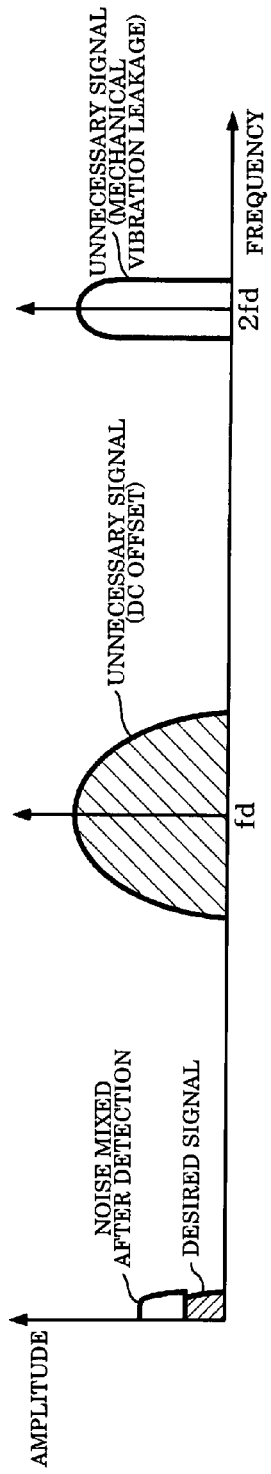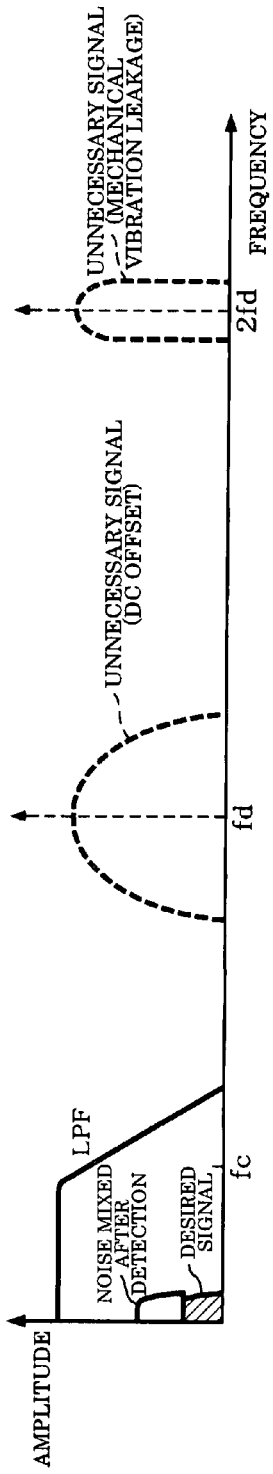
FIG. 17A BEFORE SYNCHRONOUS DETECTION
FIG. 17B AFTER SYNCHRONOUS DETECTION
FIG. 17C AFTER FILTERING PROCESS

US 7,619,474 B2

ANALOG CIRCUIT, ELECTRONIC INSTRUMENT, AND OPERATIONAL AMPLIFIER

Japanese Patent Application No. 2006-305153 filed on Nov. 10, 2006, is hereby incorporated by reference in its entirety.

BACKGROUND OF THE INVENTION

The present invention relates to an analog circuit, an electronic instrument, and an operational amplifier.

The noise of a transistor forming an analog circuit is classified as thermal noise and flicker noise. Thermal noise predominantly occurs in a high frequency band and is proportional to the absolute temperature. Flicker noise predominantly occurs in a low frequency band. The noise level of flicker noise increases as the signal frequency decreases.

In analog circuits such as a radio-controlled clock receiver device and a gyrosensor detection device, a frequency is converted using a mixer or the like (e.g., JP-A-3-226620). Specifically, the frequency of a carrier signal is converted into the frequency of a desired signal, for example. Therefore, a high signal frequency and a low signal frequency exist in a mixed state as the small-amplitude amplification target of an operational amplifier forming an analog circuit.

In known analog circuits such as a radio-controlled clock receiver device and a gyrosensor detection device, an operational amplifier has not been optimally sized taking such a difference in signal frequency into consideration. Moreover, a reduction in noise and power consumption in combination has not been taken into consideration.

SUMMARY

According to one aspect of the invention, there is provided an analog circuit comprising:

a first circuit including a first-type operational amplifier of which a frequency of an amplification target signal is a first frequency; and a second circuit including a second-type operational amplifier of which a frequency of an amplification target signal is a second frequency lower than the first frequency;

when a channel width and a channel length of a differential-stage transistor of a differential section of the first-type operational amplifier are respectively referred to as $W1a$ and $L1a$, a bias current flowing through the differential section of the first-type operational amplifier is referred to as $Ia$, a channel width and a channel length of a differential-stage transistor of a differential section of the second-type operational amplifier are respectively referred to as $W1b$ and $L1b$, and a bias current flowing through the differential section of the second-type operational amplifier is referred to as $Ib$, $W1b \times L1b > W1a \times L1a$ and $Ia > Ib$ being satisfied.

According to another aspect of the invention, there is provided an electronic instrument comprising:

the above analog circuit; and a processing section that performs processes based on information from the analog circuit.

According to a further aspect of the invention, there is provided an operational amplifier comprising:

a differential section; and an output section connected with an output node of the differential section;

the differential section including a differential-stage transistor and an active-load-stage transistor; and when the area of an arrangement region of the differential-stage transistor among elements forming the operational amplifier is referred to as Sdf, the area of an arrangement region of the elements forming the operational amplifier other than the differential-stage transistor is referred to as Sre, an effective gate voltage of the differential-stage transistor is referred to as Veff, a drain-source current is referred to as Ids, a mobility is referred to as $\mu$, a gate capacitance per unit area is referred to as Cox, a WL ratio is referred to as $RT1b$, a Boltzmann constant is referred to as k, an absolute temperature is referred to as T, an amount of electronic charge is referred to as q, and a process variation parameter is referred to as P (P>1), Sdf>Sre and L1<L3 being satisfied and the WL ratio $RT1b$ being set at a value satisfying the relationship $P \times (k \times T/q) > Veff = \{2 \times Ids/(\mu \times Cox \times RT1b)\}^{1/2} > k \times T/q$.

BRIEF DESCRIPTION OF THE SEVERAL VIEWS OF THE DRAWING

FIGS. 4A and 4B are views illustrative of a noise analysis of an operational amplifier.

FIGS. 5A to 5C are views illustrative of a noise reduction method according to one embodiment of the invention.

FIGS. 6A to 6C are views illustrative of the relationship among frequencies f1 and f2 and a corner frequency fcr.

FIGS. 7A and 7B are views illustrative of a method of setting a corner frequency fcr in first-type and second-type operational amplifiers.

FIGS. 17A to 17C are views illustrative of a frequency spectrum.

DETAILED DESCRIPTION OF THE EMBODIMENT

Figure 1:
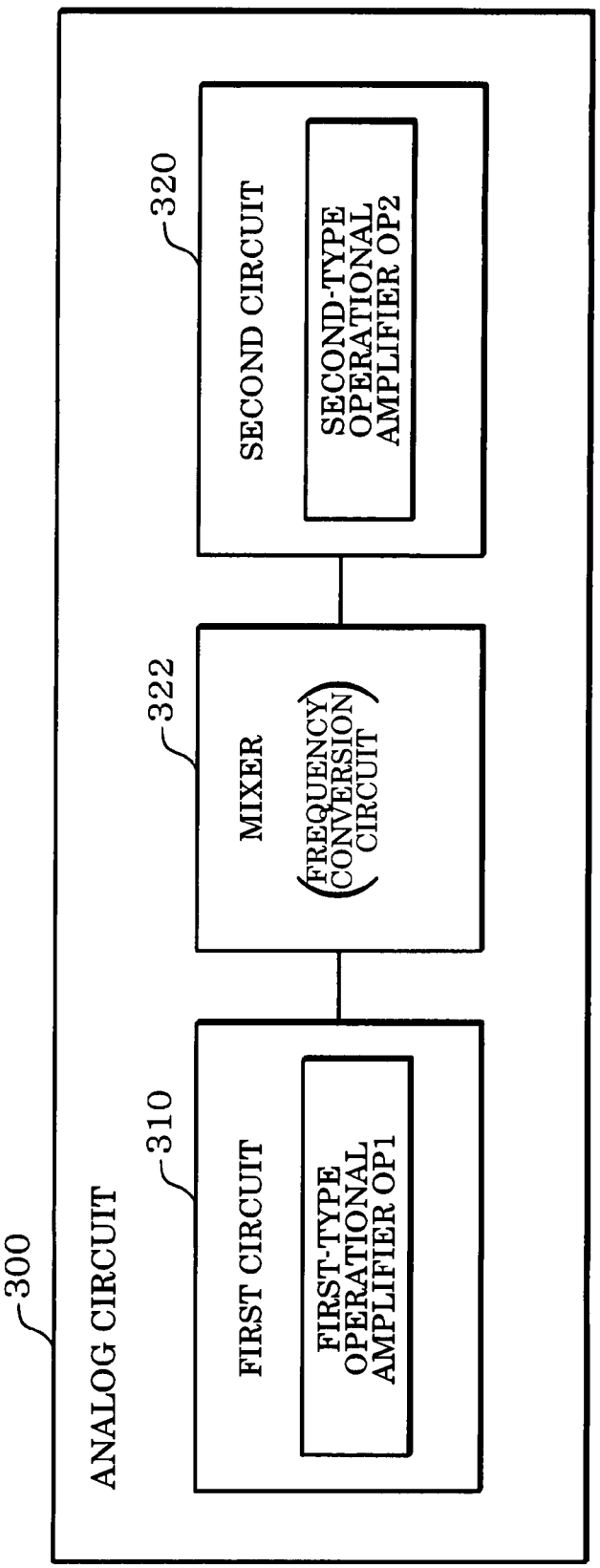
FIG. 1 shows a configuration example of an analog circuit according to one embodiment of the invention.

Aspects of the invention may provide an analog circuit, an electronic instrument, and an operational amplifier capable of reducing noise and power consumption.

According to one embodiment of the invention, there is provided an analog circuit comprising:

a first circuit including a first-type operational amplifier of which a frequency of an amplification target signal is a first frequency; and a second circuit including a second-type operational amplifier of which a frequency of an amplification target signal is a second frequency lower than the first frequency;

when a channel width and a channel length of a differential-stage transistor of a differential section of the first-type operational amplifier are respectively referred to as W1a and L1a, a bias current flowing through the differential section of the first-type operational amplifier is referred to as Ia, a channel width and a channel length of a differential-stage transistor of a differential section of the second-type operational amplifier are respectively referred to as W1b and L1b, and a bias current flowing through the differential section of the second-type operational amplifier is referred to as Ib, W1b×L1b>W1a×L1a and Ia>Ib being satisfied.

According to this embodiment, the first circuit of the analog circuit includes the first-type operational amplifier, and the second circuit includes the second-type operational amplifier. The WL product W1a×L1a of the differential-stage transistor of the first-type operational amplifier and the WL product W1b×L1b of the differential-stage transistor of the second-type operational amplifier satisfy the relationship W1b×L1b>W1a×L1a. Therefore, since the WL product W1b×L1b of the second-type operational amplifier can be increased, flicker noise of the second-type operational amplifier can be reduced, whereby the signal-to-noise ratio (SNR) of the analog circuit can be increased. On the other hand, since the WL product W1a×L1a of the first-type operational amplifier can be reduced, a situation can be prevented in which the circuit area of the first-type operational amplifier is unnecessarily increased, whereby the scale of the analog circuit can be reduced.

The bias current Ia of the differential section of the first-type operational amplifier and the bias current Ib of the differential section of the second-type operational amplifier satisfy the relationship Ia>Ib. Therefore, since the bias current Ia of the first-type operational amplifier can be increased, thermal noise of the first-type operational amplifier can be reduced, whereby the SNR of the analog circuit can be increased. On the other hand, since the bias current Ib of the second-type operational amplifier can be reduced, a situation can be prevented in which the current consumption of the second-type operational amplifier is unnecessarily increased, whereby the power consumption of the analog circuit can be reduced.

In the analog circuit according to this embodiment, when the first frequency is referred to as f1, the second frequency is referred to as f2, and a corner frequency of flicker noise and thermal noise in frequency-noise characteristics is referred to as fcr, the first-type operational amplifier may satisfy f1−fcr<fcr−f2, and the second-type operational amplifier may satisfy fcr−f2<f1−fcr.

If the relationship f1−fcr<fcr−f2 is satisfied, the corner frequency fcr can be brought close to the frequency f1, whereby the noise and the power consumption of the operational amplifier can be reduced. If the relationship fcr−f2<f1−fcr is satisfied, the corner frequency fcr can be brought close to the frequency f2, whereby the noise and the area of the operational amplifier can be reduced.

The analog circuit according to this embodiment may further comprise:

a mixer that mixes a signal with a specific frequency into a signal including a desired signal;

the first circuit may be a circuit provided in a preceding stage of the mixer; and the second circuit may be a circuit provided in a subsequent stage of the mixer.

When providing such a mixer, the signal frequency in the first circuit in the preceding stage of the mixer differs from the signal frequency in the second circuit in the subsequent stage of the mixer. According to this embodiment, noise and power consumption can be reduced by selectively using the first-type operational amplifier and the second-type operational amplifier in the preceding stage and the subsequent stage of the mixer.

In the analog circuit according to this embodiment, the first circuit may be a first amplifier circuit that amplifies an input signal; and the first amplifier circuit may include the first-type operational amplifier.

This enables the thermal noise of the first amplifier circuit to be reduced, whereby the noise of the analog circuit can be reduced.

In the analog circuit according to this embodiment, the second circuit may be a second amplifier circuit that amplifies the mixed signal from the mixer or a filter section which filters the mixed signal from the mixer; and the second amplifier circuit or the filter section may include the second-type operational amplifier.

This enables the flicker noise of the second amplifier circuit or the filter section to be reduced, whereby the noise of the analog circuit can be reduced.

In the analog circuit according to this embodiment, when a channel length of an active-load-stage transistor of the differential section of the second-type operational amplifier is referred to as L3b, L1b<L3b may be satisfied.

This further reduces the flicker noise of the second-type operational amplifier.

In the analog circuit according to this embodiment, when a WL ratio of the differential-stage transistor of the first-type operational amplifier is referred to as RT1a and a WL ratio of an active-load-stage transistor of the first-type operational amplifier is referred to as RT3a, RT1a>RT3a may be satisfied.

This further reduces the thermal noise of the first amplifier circuit.

In the analog circuit according to this embodiment, when an effective gate voltage of the differential-stage transistor of the second-type operational amplifier is referred to as Veff, a drain-source current is referred to as Ids, a mobility is referred to as μ, a gate capacitance per unit area is referred to as Cox, a WL ratio is referred to as RT1b, a Boltzmann constant is referred to as k, an absolute temperature is referred to as T, an amount of electronic charge is referred to as q, and a process variation parameter is referred to as P (P>1), the WL ratio RT1b may be set at a value satisfying the relationship $$P \times (k \times T/q) > V\text{eff} = \{2 \times Ids/(\mu \times Cox \times RT1b)\}^{1/2} > k \times T/q.$$

According to this configuration, since the differential-stage transistor of the second-type operational amplifier can be prevented from operating in the weak inversion region or at the boundary between the weak inversion region and the strong inversion region, an increase in flicker noise due to an excessive increase in the WL ratio RT1b can be minimized.

In the analog circuit according to this embodiment, when the area of an arrangement region of the differential-stage transistor among elements forming the second-type operational amplifier is referred to as Sdf and the area of an arrangement region of the elements forming the second-type operational amplifier other than the differential-stage transistor is referred to as Sre, Sdf>Sre may be satisfied.

This enables the differential-stage transistor with a large WL product to be disposed in the arrangement region with an area of Sdf, whereby flicker noise can be reduced.

In the analog circuit according to this embodiment, the differential-stage transistor of the second-type operational amplifier may include J (J>2) transistors connected in parallel; and the J transistors connected in parallel may be disposed in the arrangement region of the differential-stage transistor.

This enables the WL ratio to be increased while increasing the WL product of the differential-stage transistor, whereby flicker noise can be efficiently reduced.

In the analog circuit according to this embodiment, the active-load-stage transistor of the second-type operational amplifier may include I (J>I>2) transistors connected in parallel; and the J transistors forming the differential-stage transistor may be arranged along a direction X, and the I transistors forming the active-load-stage transistor may be arranged along the direction X on a direction Y side of the J transistors.

This enables the J transistors forming the differential-stage transistor and the J transistors forming the active-load-stage transistor to be efficiently disposed symmetrically, whereby the layout efficiency can be increased.

In the analog circuit according to this embodiment, the mixer may include a third-type operational amplifier; and when a channel width and a channel length of a differential-stage transistor of a differential section of the third-type operational amplifier are respectively referred to as W1$c$ and L1$c$ and a bias current which flows through the differential section of the third-type operational amplifier is referred to as Ic, W1$c$×L1$c$>W1$a$×L1$a$ and Ic>Ib may be satisfied.

If the relationship W1$c$×L1$c$>W1$a$×L1$a$ is satisfied, the WL product W1$c$×L1$c$ of the third-type operational amplifier can be increased, whereby the flicker noise of the third-type operational amplifier can be reduced. If the relationship Ic>Ib is satisfied, the bias current Ic of the third-type operational amplifier can be increased, whereby the thermal noise of the third-type operational amplifier can be reduced. This enables the SNR of the analog circuit to be increased.

The analog circuit according to this embodiment may further comprise:

a reference voltage supply circuit that supplies an analog reference voltage;

the reference voltage supply circuit may include:

a first supply circuit that includes a reference-voltage first-type operational amplifier and supplies the analog reference voltage to the first circuit; and a second supply circuit that includes a reference-voltage second-type operational amplifier and supplies the analog reference voltage to the second circuit; and when a channel width and a channel length of a differential-stage transistor of a differential section of the reference-voltage first-type operational amplifier are respectively referred to as W1$d$ and L1$d$, a bias current flowing through the differential section of the reference-voltage first-type operational amplifier is referred to as Id, a channel width and a channel length of a differential-stage transistor of a differential section of the reference-voltage second-type operational amplifier are respectively referred to as W1$e$ and L1$e$, and a bias current flowing through the differential section of the reference-voltage second-type operational amplifier is referred to as Ie, W1$e$×L1$e$>W1$d$×L1$d$ and Id>Ie may be satisfied.

If the relationship Id>Ie is satisfied, thermal noise superimposed on the analogue reference voltage supplied from the first supply circuit can be minimized, whereby an increase in thermal noise in the first circuit of the analog circuit can be prevented. If the relationship W1$e$×L1$e$>W1$d$×L1$d$ is satisfied, flicker noise superimposed on the analogue reference voltage supplied from the second supply circuit can be minimized, whereby the flicker noise of the second circuit of the analog circuit can be reduced.

In the analog circuit according to this embodiment, the first frequency may be a frequency of a carrier signal, and the second frequency may be a frequency of a desired signal carried by the carrier signal.

According to another embodiment of the invention, there is provided an electronic instrument comprising:

one of the above analog circuits; and a processing section that performs processes based on information from the analog circuit.

According to a further embodiment of the invention, there is provided an operational amplifier comprising:

a differential section; and an output section connected with an output node of the differential section;

the differential section including a differential-stage transistor pair and an active-load-stage transistor pair; and when the area of an arrangement region of the differential-stage transistor pair among elements forming the operational amplifier is referred to as Sdf, the area of an arrangement region of the elements forming the operational amplifier other than the differential-stage transistor pair is referred to as Sre, a channel length of a differential-stage transistor of the differential-stage transistor pair is referred to as L1, an effective gate voltage of the differential-stage transistor is referred to as Veff, a drain-source current is referred to as Ids, a mobility is referred to as μ, a gate capacitance per unit area is referred to as Cox, a WL ratio is referred to as RT1, a channel length of a active-load-stage transistor of the active-load-stage transistor pair is referred to as L3, a Boltzmann constant is referred to as k, an absolute temperature is referred to as T, an amount of electronic charge is referred to as q, and a process variation parameter is referred to as P (P>1), Sdf>Sre and L1<L3 being satisfied and the WL ratio RT1 being set at a value satisfying the relationship $$P\times(kT/q) > Veff = \{2\times Ids/(\mu \times Cox \times RT1)\}^{1/2} > k\times T/q.$$

In this embodiment, since Sdf>Sre is satisfied, the differential-stage transistor with a large WL product can be disposed in the arrangement region with an area of Sdf, whereby flicker noise can be reduced. Moreover, flicker noise can be further reduced by satisfying L1<L3. It is efficient to increase the WL ratio RT1 in order to satisfy the relationship Sdf>Sre and L1<L3. However, if the WL ratio RT1 is increased to a large extent, the differential-stage transistor operates in the weak inversion region, whereby flicker noise may be increased. In this embodiment, the WL ratio RT1 is set so that the effective gate voltage satisfies P×(k×T/q)Veff>k×T/q. According to this configuration, since the differential-stage transistor of the second-type operational amplifier can be prevented from operating in the weak inversion region or at the boundary between the weak inversion region and the strong inversion region, an increase in flicker noise due to an excessive increase in the WL ratio RT1 can be minimized.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention. For example, the following description is given taking a radio-controlled clock receiver device or a gyrosensor detection device as an analog circuit to which the invention is applied. Note that the invention is not limited thereto.

1. Configuration of Analog Circuit

FIG. 1 shows a configuration example of an analog circuit (analog front-end circuit) 300 according to this embodiment. The analog circuit 300 includes a first circuit 310 and a second circuit 320.

The first circuit 310 includes a first-type operational amplifier OP1 of which the frequency of the amplification target signal (small-signal amplification target signal of the operational amplifier) is a first frequency. Specifically, the first circuit 310 includes at least one first-type operational amplifier OP1.

The second circuit 320 includes a second-type operational amplifier OP2 of which the frequency of the amplification target signal is a second frequency lower than the first frequency. Specifically, the second circuit 320 includes at least one second-type operational amplifier OP2.

For example, an input signal (reception signal or sensor signal) with the first frequency from an antenna, a sensor, or the like is input to the first circuit 310. The first circuit 310 includes an amplifier circuit, for example. The amplifier circuit amplifies the input signal using the first-type operational amplifier OP1. In this case, the input signal (carrier signal) as the amplification target signal is a signal with the high first frequency.

A mixer (frequency conversion circuit) 322 may be provided between the first circuit 310 and the second circuit 320. Specifically, the first circuit 310 may be a circuit provided in the preceding stage of the mixer 322, and the second circuit 320 may be a circuit provided in the subsequent stage of the mixer 322. The mixer 322 mixes a signal with a given frequency (e.g., station frequency signal or synchronization signal) into a signal including a desired signal.

A signal of which the frequency has been converted into the second frequency due to mixing (frequency conversion) of the mixer 322 is input to the second circuit 320. An amplifier circuit, a filter section, or an output circuit of the second circuit 320 subjects the signal with the second frequency (amplification target signal) to small-amplitude amplification.

The first-type operational amplifier OP1 is an operational amplifier of which the thermal noise at the first frequency (e.g., carrier frequency, modulation frequency, or resonance frequency) is lower than that of the second-type operational amplifier OP2, for example. The second-type operational amplifier OP2 is an operational amplifier of which the flicker noise at the second frequency (e.g., frequency of a desired signal carried by a carrier signal or maximum frequency in a frequency band of a desired signal) is lower than that of the first-type operational amplifier OP1.

Specifically, the first frequency (e.g., several tens of kilohertz to several hundreds of kilohertz) which is the signal frequency of the first-type operational amplifier OP1 is indicated by f1, the second frequency (e.g., several hertz to several hundreds of hertz) which is the signal frequency of the second-type operational amplifier OP2 is indicated by f2, and the corner frequency of flicker noise and thermal noise is indicated by fcr. In this case, the first-type operational amplifier OP1 satisfies the relationship $f1-fcr<fcr-f2$, for example. Specifically, the first-type operational amplifier OP1 is sized so that the first frequency f1 is set to be close to the corner frequency fcr. The second-type operational amplifier OP2 satisfies the relationship $fcr-f2<f1-fcr$, for example. Specifically, the second-type operational amplifier OP2 is sized so that the second frequency f2 is set to be close to the corner frequency fcr.

The channel width and the channel length of the differential-stage transistor of the differential section of the first-type operational amplifier OP1 are respectively referred to as W1$a$ and L1$a$, and the bias current (current value) flowing through the differential section is referred to as Ia. The channel width and the channel length of the differential-stage transistor of the differential section of the second-type operational amplifier OP2 are respectively referred to as W1$b$ and L1$b$, and the bias current flowing through the differential section is referred to as Ib. In this case, the relationship $W1b \times L1b > W1a \times L1a$ and $Ia > Ib$ is satisfied, for example.

When providing the mixer 322 (frequency conversion circuit) between the first circuit 310 and the second circuit 320, the mixer 322 may include a third-type operational amplifier OP3, for example. The third-type operational amplifier OP3 is an operational amplifier of which the thermal noise at the frequency f1 is lower than that of the second-type operational amplifier OP2 (or the first-type operational amplifier OP1) and the flicker noise at the frequency f2 is lower than that of the first-type operational amplifier OP1 (or the second-type operational amplifier OP2). For example, when the channel width and the channel length of the differential-stage transistor of the differential section of the third-type operational amplifier OP3 are respectively referred to as W1$c$ and L1$c$, and the bias current flowing through the differential section is referred to as Ic, the relationship $W1c \times L1c > W1a \times L1a$ and Ic>Ib is satisfied. Alternatively, the relationship $W1c \times L1c > W1b \times L1b$ and Ic>Ia may be satisfied.

Figure 2:
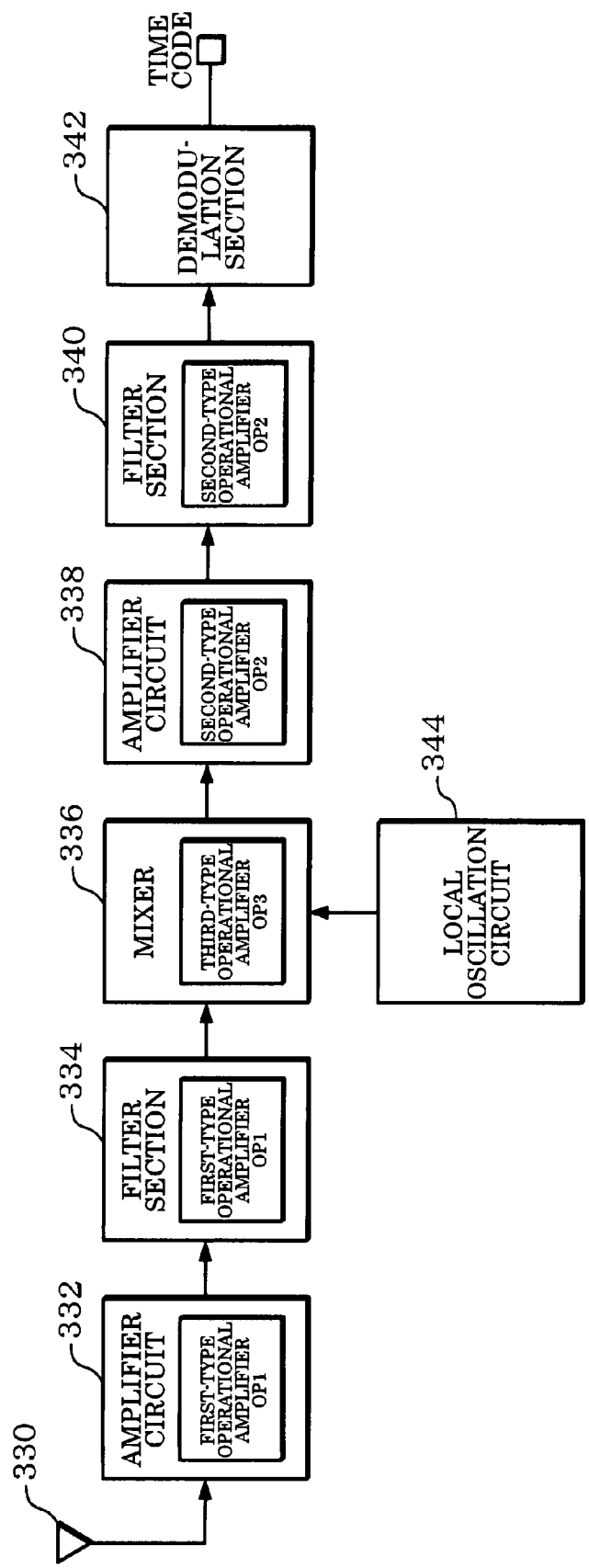
FIG. 2 shows a configuration example of a radio-controlled clock receiver device.
Figure 3:
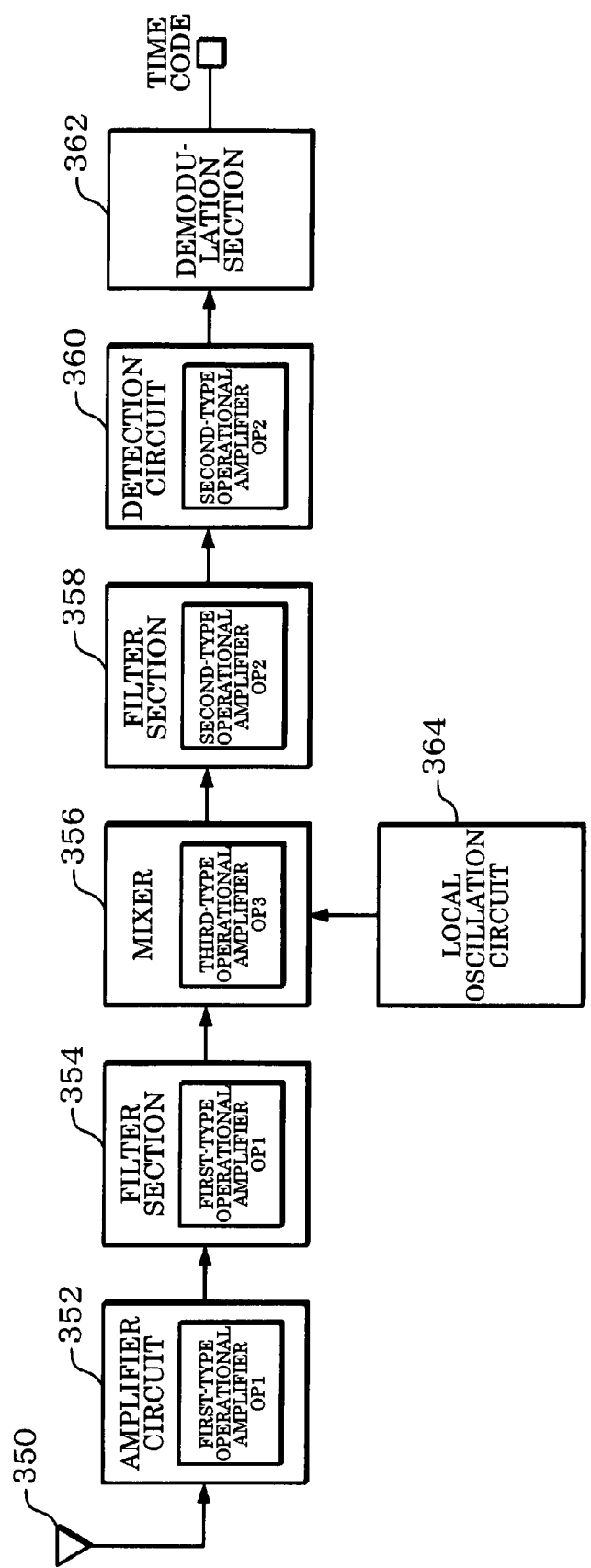
FIG. 3 shows another configuration example of a radio-controlled clock receiver device.

FIGS. 2 and 3 show configuration examples of a radio-controlled clock receiver device as an example of the analog circuit 300. The receiver device is not limited to the configurations shown in FIGS. 2 and 3. Various modification may be made such as omitting some elements or adding another element.

The receiver device shown in FIG. 2 is an example of a direct-conversion receiver device. At present, a long-frequency standard radio wave containing a time code (time data) is transmitted in each country (e.g., Japan, Germany, and the United Kingdom). In Japan, a long-frequency standard radio wave (40 KHz and 60 KHz) amplitude-modulated by the time code is transmitted from two stations. Specifically, the time data is transmitted as binary data in cycles of 60 seconds. The radio-controlled clock receives such time code radio waves and corrects the time data of a clock circuit. Therefore, the radio-controlled clock receiver device extracts a signal at a desired frequency by detecting and demodulating the received radio waves to obtain the time code.

In FIG. 2, an antenna 330 formed using a bar antenna or the like receives the long-frequency standard radio wave, and the received radio wave is converted into an electric signal and output. An amplifier circuit (RF amplifier circuit) 332 amplifies and outputs the signal from the antenna 330. A filter section 334 has high-pass filter frequency characteristics, for example. The filter section 334 filters the signal from the amplifier circuit 332.

A mixer (frequency conversion circuit) 336 mixes a signal with a local oscillation frequency from a local oscillation circuit 344 into the signal from the filter section 334 to directly convert the signal into a baseband signal (several hertz) (direct conversion).

The amplifier circuit 338 amplifies the signal from the mixer 336. A filter section 340 has low-pass filter frequency characteristics, for example. The filter section 340 filters the signal from the amplifier circuit 338. A demodulation section 342 demodulates the signal from the filter section 340, and outputs the time code obtained by demodulation. The radio-controlled clock corrects the time data using the time code.

The receiver device shown in FIG. 3 is an example of a superheterodyne receiver device. An amplifier circuit 352 amplifies a signal from an antenna 350. A filter section 354 has band-pass filter frequency characteristics, for example. The filter section 354 filters the signal from the amplifier circuit 352.

A mixer 336 mixes a signal with a local oscillation frequency from a local oscillation circuit 364 into the signal from the filter section 354 to generate a signal with an intermediate frequency (several hundreds of hertz) (superheterodyne conversion).

A filter section 358 has band-pass filter frequency characteristics, for example. The filter section 358 filters the signal from the mixer 356 so that a frequency component within a specific frequency range around the intermediate frequency passes through and a frequency component outside the specific frequency range is blocked. A detection circuit 360 detects (e.g., envelope detection) the signal from the filter section 358. A demodulation section 362 demodulates the detection signal from the detection circuit 360, and outputs the time code obtained by demodulation.

In FIG. 2, the amplifier circuit 332 (first amplifier circuit) and the filter section 334 correspond to the first circuit 310 shown in FIG. 1, for example. The amplifier circuit 332 and the filter section 334 may be formed using the first-type operational amplifier OP1.

In FIG. 2, the amplifier circuit 338 (second amplifier circuit) and the filter section 340 correspond to the second circuit 320 shown in FIG. 1, for example. The amplifier circuit 338 and the filter section 340 may be formed using the second-type operational amplifier OP2.

In FIG. 3, the amplifier circuit 352 and the filter section 354 correspond to the first circuit 310 shown in FIG. 1, for example. The amplifier circuit 352 and the filter section 354 may be formed using the first-type operational amplifier OP1.

In FIG. 3, the filter section 358 and the detection circuit 360 correspond to the second circuit 320 shown in FIG. 1, for example. The filter section 358 and the detection circuit 360 may be formed using the second-type operational amplifier OP2.

The analog circuit 300 to which the method according to this embodiment method can be applied is not limited to the radio-controlled clock receiver devices shown in FIGS. 2 and 3. For example, the analog circuit 300 may be applied to an infrared remote control receiver device, or may be applied to detection devices of various sensors such as a gyrosensor described later.

2. Noise Reduction Method 2.1 Noise Analysis

FIG. 4A shows a configuration example of an operational amplifier used in this embodiment. The operational amplifier includes a differential section 200 and an output section 210.

The differential section 200 includes differential-stage transistors M1 and M2 and active-load-stage transistors M3 and M4. The differential section 200 also includes a bias-stage transistor M5. The differential-stage transistors M1 and M2 are provided between a node N1 and nodes N2 and N3, respectively. Differential input signals IM and IP are input to the gates of the differential-stage transistors M1 and M2. The active-load-stage transistors M3 and M4 are provided between the nodes N2 and N3 and a power supply AGND (first power supply), respectively. The node N2 is connected with the gates of the active-load-stage transistors M3 and M4. The bias-stage transistor M5 is provided between a power supply VDD (second power supply) and the node N1. A bias node N4 of a bias circuit 212 formed of a transistor M8 and a current source IS is connected with the gate of the bias-stage transistor M5. This allows a bias current IBD corresponding to a bias current IBS of the bias circuit 212 to flow through the differential section 200.

The output section 210 includes a drive-stage transistor M6 and a bias-stage transistor M7 provided between the power supply VDD and the power supply AGND. The output node N3 of the differential section 200 is connected with the gate of the drive-stage transistor M6, and the bias node N4 is connected with the gate of the bias-stage transistor M7. A phase-compensation capacitor CF and a resistor RF are provided between the nodes N3 and N5.

The configuration of the operational amplifier according to this embodiment is not limited to the configuration shown in FIG. 4A. FIG. 4A shows an example in which the differential-stage transistors M1 and M2 and the bias-stage transistor M5 are P-type transistors and the active-load-stage transistors M3 and M4 are N-type transistors. Note that the transistors M1, M2, and M5 may be N-type transistors and the transistors M3 and M4 may be P-type transistors. Modifications may also be made such as omitting some of the elements (transistor and capacitor) shown in FIG. 4A or adding another element.

Noise analysis on the operational amplifier shown in FIG. 4A is described below. FIG. 4B shows an small-signal equivalent circuit of the transistor. Since noise is expressed in units of $V^2$ ($V^2/Hz$), the equivalent circuit shown in FIG. 4B is also expressed in units of $V^2$. In the equivalent circuit shown in FIG. 4B, in order to calculate the input-referred noise (gate-referred noise) of the transistor, a voltage source with a noise of $Svg=Vn^2$ is provided at the gate of the transistor. A current source of $gm^2$ ($Vgs^2+Vn^2$) and a resistor of $1/gds^2$ are provided between the drain and the source.

As shown in FIG. 5A, noise is classified as flicker noise (1/f noise) and thermal noise. Flicker noise occurs when electrons are trapped by or released from dangling bonds at the interface between a gate oxide film and a silicon substrate. Flicker noise increases as the frequency decreases. On the other hand, thermal noise occurs due to random movement of electrons when the channel region of the transistor is considered to be a resistor. Thermal noise is proportional to the absolute temperature.

In the input-referred noise equivalent circuit shown in FIG. 4B, flicker noise and thermal noise are respectively calculated by the following equations (1) and (2).

$$Vn^2 = \frac{K}{C_{ox} \times W \times L \times f} \quad (1)$$

$$Vn^2 = \frac{8}{3} \times \frac{k \times T}{g_m} \quad (2)$$

In the equation (1), Cox represents the gate capacitance of the transistor per unit area, W represents the channel width, L represents the channel length, f represents the frequency, and K represents the flicker noise constant depending on the manufacturing process. In the equation (2), gm represents the transconductance, k represents the Boltzmann constant, and T represents the absolute temperature.

In this embodiment, the transfer function is calculated by replacing the operational amplifier circuit shown in FIG. 4A with the equivalent circuit shown in FIG. 4B. In this case, only the higher-order terms accounting for 99% of the whole are derived by numerical analysis on the assumption that the size (W and L), the noise level, and the drain-source current of all the transistors of the operational amplifier are the same. The noise Svg (noise spectrum) of the operational amplifier is calculated by the following equation (3).

$$Svg = V_{n1}^2 + V_{n2}^2 + \frac{g_{m3}^2 \times V_{n3}^2}{g_{m1}^2} + \frac{g_{m3}^2 \times V_{n4}^2}{g_{m1}^2} \quad (3)$$

In the equation (3), Vn1 Vn2, Vn3, and Vn4 represent the gate-noise voltages of the transistors M1, M2, M3, and M4 shown in FIG. 4A, and gm1, gm2, gm3, and gm4 represent the transconductances of the transistors M1, M2, M3, and M4.

As is clearly from the numerical analysis result of the equation (3), most of the noise Svg of the operational amplifier is caused by noise of the differential-stage transistors M1 and M2 and the active-load-stage transistors M3 and M4 of the differential section 200 shown in FIG. 4A. Therefore, the channel widths W and the channel lengths L of the transistors M1, M2, M3, and M4 may be optimized when sizing the operational amplifier.

Flicker noise is analyzed as follows. The gate-noise voltages Vn1, Vn2, Vn3, and Vn4 with regard to flicker noise are calculated by the following equations (4), (5), (6), and (7) from the equation (1).

$$V_{n1} = \left( \frac{K_p}{C_{ox} \times W1 \times L1 \times f} \right)^{\frac{1}{2}} \quad (4)$$

$$V_{n2} = \left( \frac{K_p}{C_{ox} \times W1 \times L1 \times f} \right)^{\frac{1}{2}} \quad (5)$$

$$V_{n3} = \left( \frac{K_n}{C_{ox} \times W3 \times L3 \times f} \right)^{\frac{1}{2}} \quad (6)$$

$$V_{n4} = \left( \frac{K_n}{C_{ox} \times W3 \times L3 \times f} \right)^{\frac{1}{2}} \quad (7)$$

In the equations (4) to (7), W1 and L1 respectively represent the channel width and the channel length of the differential-stage transistors M1 and M2, and W3 and L3 respectively represent the channel width and the channel length of the active-load-stage transistors M3 and M4. Note that the equations (4) to (7) are given on the assumption that the channel width W2 and the channel length L2 of the transistor M2 are the same as the channel width W1 and the channel length L1 of the transistor M1, and the channel width W4 and the channel length L4 of the transistor M4 are the same as the channel width W3 and the channel length L3 of the transistor M3. Kp and Kn respectively represent the process-dependent constants of the P-type transistor and the N-type transistor.

The transconductance gm1(=gm2) of the differential-stage transistors M1 and M2 and the transconductance gm3 (=gm4) of the active-load-stage transistors M3 and M4 are calculated by the following equations (8) and (9).

$$g_{m1} = \left( \frac{2\mu_p \times C_{ox} \times W1}{L1} \times Ids \right)^{\frac{1}{2}} \quad (8)$$

$$g_{m3} = \left( \frac{2\mu_n \times C_{ox} \times W3}{L3} \times Ids \right)^{\frac{1}{2}} \quad (9)$$

In the equations (8) and (9), μp and μn respectively represent the mobilities of the P-type transistor and the N-type transistor, and Ids represents the drain-source current of the transistor, provided that the transistors M1 to M4 have the same drain-source current Ids.

Flicker noise SvgFlc of the operational amplifier is calculated by the following equation (10) by substituting the equations (4) to (9) into the equation (3).

$$SvgFlc = \frac{2K_p}{C_{ox} \times W1 \times L1 \times f} + \frac{2L1 \times \mu_n \times K_n}{\mu_p \times W1 \times L3^2 \times C_{ox} \times f} \quad (10)$$

Thermal noise is analyzed as follows. The gate-noise voltages Vn1, Vn2, Vn3, and Vn4 with regard to thermal noise are calculated by the following equations (11), (12), (13), and (14) from the equation (2).

$$V_{n1} = \left( \frac{8}{3} \times \frac{k \times T}{g_{m1}} \right)^{\frac{1}{2}} \quad (11)$$

$$V_{n2} = \left( \frac{8}{3} \times \frac{k \times T}{g_{m1}} \right)^{\frac{1}{2}} \quad (12)$$

$$V_{n3} = \left( \frac{8}{3} \times \frac{k \times T}{g_{m3}} \right)^{\frac{1}{2}} \quad (13)$$

$$V_{n4} = \left( \frac{8}{3} \times \frac{k \times T}{g_{m3}} \right)^{\frac{1}{2}} \quad (14)$$

Thermal noise SvgThm of the operational amplifier is calculated by the following equation (15) by substituting the equations (11) to (14) into the equation (3).

$$SvgThm = \frac{16}{3} \times \frac{k \times T}{g_{m1}} + \frac{16}{3} \times \frac{g_{m3} \times k \times T}{g_{m1}^2} \quad (15)$$

The thermal noise SvgThm of the operational amplifier is calculated by the following equation (16) by substituting the equations (8) and (9) into the equation (15).

$$SvgThm = \frac{8}{3} \times \frac{k \times T \times \sqrt{2} \times \sqrt{L1}}{\sqrt{Ids} \times \sqrt{\mu_p \times C_{ox}} \times \sqrt{W1}} + \quad (16)$$

$$\frac{8}{3} \times \frac{k \times T \times \sqrt{2} \times L1 \times \sqrt{\mu_n \times C_{ox}} \times \sqrt{W3}}{\sqrt{Ids} \times \sqrt{L3} \times \mu_p \times C_{ox} \times W1}$$

When excluding the constant determined by the natural world and the constant which depends only on the process from the equation (10) relating to the flicker noise SvgFlc and the equation (16) relating to the thermal noise SvgThm, W1, W3, L1, L3, and Ids are variables which can be managed in the design stage. Therefore, the flicker noise SvgFlc is reduced by satisfying the following items in view of the equation (10).

(P1) Increase the WL product W1×L1 (gate area) of the differential-stage transistors M1 and M2 as much as possible. This reduces the first term of the equation (10), whereby the flicker noise SvgFlc is reduced.

(P2) Reduce the ratio L1/L3 as much as possible. Specifically, the channel lengths L1 and L3 are set so that L1<L3, for example. This reduces the second term of the equation (10), whereby the flicker noise SvgFlc is reduced. As a result, the WL product W3×L3 of the active-load-stage transistors M3 and M4 increases.

(P3) The flicker noise SvgFlc is independent of the drain-source current Ids. Therefore, when taking only the flicker noise into consideration, power consumption can be reduced by reducing the drain-source current Ids.

As is clear from the above description, the flicker noise SvgFlc and power consumption can be reduced by increasing the WL product W1×L1 of the differential-stage transistor and reducing the bias current IBD (Ids) flowing through the differential section.

The thermal noise SvgThm is reduced by satisfying the following items in view of the equation (16).

(Q1) Increase the current Ids (IBD) as much as possible. This reduces the first and second terms of the equation (16), whereby the thermal noise SvgThm is reduced.

(Q2) Increase the WL ratio RT1=W1/L1 of the differential-stage transistors M1 and M2 as much as possible, and reduce the WL ratio RT3=W3/L3 of the active-load-stage transistors M3 and M4 as much as possible. Specifically, the ratios RT1 and RT3 are set so that RT1>RT3, for example.

(Q3) The thermal noise SvgThm is independent of the WL products W1×L1 and W3×L3. Therefore, when taking only the thermal noise into consideration, the area of the operational amplifier can be reduced by reducing the WL products W1×L1 and W3×L3.

As is clear from the above description, the thermal noise SvgThm and the area of the operational amplifier can be reduced by increasing the bias current IBD flowing through the differential section and reducing the WL products W1×L1 and W3×L3 to provide a small operational amplifier.

2.2 Selective Use of Operational Amplifiers

As is clear from the items (P1) and (Q1), the noise of the operational amplifier can be reduced by increasing the WL product W1×L1 of the differential-stage transistor to reduce flicker noise and increasing the bias current IBD of the differential section to reduce thermal noise.

However, the layout area of the operational amplifier is increased by increasing the WL product W1×L1, whereby the circuit scale is increased. On the other hand, the current consumption of the operational amplifier is increased by increasing the bias current IBD, thereby hindering a reduction in power consumption.

In this embodiment, in order to achieve a reduction in noise, circuit area, and power consumption in combination, the first-type and second-type operational amplifiers OP1 and OP2 are provided and are used selectively.

As transistor noise, flicker noise predominantly occurs in a low frequency region, and thermal noise predominantly occurs in a high frequency region, as shown in FIG. 5A.

As shown in FIG. 5A, the frequency f1 (first frequency) of the amplification target signal (small-signal amplification target signal of the operational amplifier) of the first circuit 310 shown in FIG. 1 is high, and the frequency f2 (second frequency) of the amplification target signal of the second circuit 320 is low.

Specifically, the frequency f1 corresponds to the frequency of the carrier signal. For example, the frequency f1 is a frequency in a band of several tens of kilohertz to several hundreds of kilohertz (AC band).

On the other hand, the frequency f2 corresponds to the frequency of the desired signal carried by the carrier signal (maximum frequency in the frequency band of the desired signal). For example, the frequency f2 is a frequency in a band of several hertz to several hundreds of hertz (DC band).

In this embodiment, the first-type operational amplifier OP1 which reduces thermal noise as compared with the second-type operational amplifier OP2 is used in the first circuit 310 in the preceding stage of the mixer 322 which extracts the desired signal from the carrier signal. Specifically, an operational amplifier is used of which the thermal noise at the frequency f1 of the carrier signal is lower than that of the second-type operational amplifier OP2.

On the other hand, the second-type operational amplifier OP2 which reduces flicker noise as compared with the first-type operational amplifier OP1 is used in the circuit in the subsequent stage of the mixer 322. Specifically, an operational amplifier is used of which the flicker noise at the frequency f2 of the desired signal is lower than that of the first-type operational amplifier OP1.

In FIG. 5B, the WL product of the differential-stage transistor of the first-type operational amplifier OP1 is indicated by W1×L1=W1a×L1a, and the bias current flowing through the differential section is indicated by IBD=Ia, for example. The frequency (operating frequency) of the amplification target signal of the first-type operational amplifier OP1 is indicated by fop=f1. The WL ratio of the differential-stage transistor is indicated by RT1=RT1a=W1a/L1a, and the WL ratio of the active-load-stage transistor is indicated by RT3=RT3a=W3a/L3a.

The WL product of the differential-stage transistor of the second-type operational amplifier OP2 is indicated by W1×L1=W1b×L1b, and the bias current flowing through the differential section is indicated by IBD=Ib. The frequency of the amplification target signal of the second-type operational amplifier OP2 is indicated by fop=f2. The channel length ratio of the differential-stage transistor and the active-load-stage transistor is indicated by L1/L3=L1b/L3b. The WL product of the third-type operational amplifier OP3 is indicated by W1×L1=W1c×L1c, and the bias current flowing through the differential section is indicated by IBD=Ic.

In this embodiment, the relationship W1b×L1b>W1a×L1a, Ia>Ib, and f1>f2 is satisfied between the first-type and second-type operational amplifiers OP1 and OP2, as shown in FIG. 5C. The relationship RT1a>RT3a is satisfied for the first-type operational amplifier OP1, and the relationship L1b<L3b is satisfied for the second-type operational amplifier OP2. The relationship W1c×L1c>W1a×L1a and Ic>Ib is satisfied for the third-type operational amplifier OP3. Note that the relationship W1c×L1c>W1b×L1b and Ic>Ia may be satisfied.

For example, flicker noise can be reduced by increasing the WL product W1×L1 of the differential-stage transistor, as shown in FIG. 6A and described in the item (P1), thermal noise can be reduced by increasing the bias current IBD of the differential section, as shown in FIG. 6A and described in the item (Q1). The first-type operational amplifier OP1 has the high signal frequency f1, and the second-type operational amplifier OP2 has the low signal frequency f2.

In this embodiment, as shown in FIG. 6B, thermal noise which predominantly occurs at the high frequency f1 is effectively reduced by increasing the bias current IBD=Ia of the first-type operational amplifier OP1 having the high signal frequency f1, thereby reducing the noise of the entire system. Specifically, the bias current Ia of the first-type operational amplifier OP1 is set to be about twice to ten times, and preferably about four to seven times the bias current Ib of the second-type operational amplifier OP2, for example. On the other hand, since the effect of flicker noise is small at the high frequency f1, the layout area of the operational amplifier is unnecessarily increased when increasing the WL product W1×L1=W1a×L1a of the first-type operational amplifier OP1. This does not contribute to a reduction in the noise of the entire system. In this embodiment, since the WL product W1a×L1a is set to be smaller than the WL product W1b×L1b, a situation in which the layout area is unnecessarily increased can be prevented.

In this embodiment, as shown in FIG. 6C, flicker noise which predominantly occurs at the low frequency f2 is effectively reduced by increasing the WL product W1×L1=W1b×L1b of the second-type operational amplifier OP2 having the low signal frequency f2, thereby reducing the noise of the entire system. Specifically, the WL product W1b×L1b of the second-type operational amplifier OP2 is set to be about 10 to 100 times, and preferably about 30 to 60 times the WL product W1a×L1a of the first-type operational amplifier OP1, for example. On the other hand, since the effect of thermal noise is small at the low frequency f2, the current consumption of the operational amplifier is unnecessarily increased when increasing the bias current IBD=Ib. This contributes to a reduction in power consumption of the entire system to only a small extent. In this embodiment, since the bias current Ib is set to be lower than the bias current Ia, a situation in which the current consumption is unnecessarily increased can be prevented.

In the first-type operational amplifier OP1 mainly aiming at reducing thermal noise, thermal noise can be reduced by increasing the WL ratio RT1a=W1a/L1a as much as possible and reducing the WL ratio RT3a=W3a/L3a as much as possible, as is clear from the equation (16) and the item (Q2). Therefore, the transistors of the first-type operational amplifier OP1 are sized so that the relationship RT1a>RT3a is satisfied. Specifically, the WL ratio RT1a is set to be about twice to eight times, and preferably about three to six times the WL ratio RT3a, for example. This further reduces the noise of the entire system.

In the second-type operational amplifier OP2 mainly aiming at reducing flicker noise, flicker noise can be reduced by reducing the ratio L1b/L3b as much as possible, as is clear from the equation (10) and the item (P2).

Therefore, the transistors of the second-type operational amplifier OP2 are sized so that the relationship L1b<L3b is satisfied. Specifically, the channel length L1b is set to be about 0.4 to 0.8 times the channel length L3b, for example. This further reduces the noise of the entire system.

2.3 Corner Frequency

In this embodiment, the transistors of the first-type and second-type operational amplifiers OP1 and IP2 are sized so that frequencies f1 and f2 and the corner frequency fcr have the relationship shown in FIGS. 6B and 6C, for example.

Specifically, the first-type operational amplifier OP1 is designed so that the relationship f1-fcr<fcr-f2 is satisfied, as shown in FIG. 6B. The second-type operational amplifier OP2 is designed so that the relationship fcr-f2<f1-fcr is satisfied, as shown in FIG. 6C.

The corner frequency fcr is the frequency corresponding to the intersection of the flicker noise characteristic line and the thermal noise characteristic line in the frequency-noise characteristics shown in FIGS. 6A to 6C.

For example, when the corner frequency fcr is set at a position indicated by E1 in the first-type operational amplifier OP1 shown in FIG. 7A, the noise at the frequency f1 increases, whereby thermal noise cannot be effectively reduced. On the other hand, when the corner frequency fcr is set at a position indicated by E2, the bias current IBD unnecessarily increases, thereby hindering a reduction in power consumption.

In this embodiment, the transistors of the first-type operational amplifier OP1 are sized so that the corner frequency fcr is set near the frequency f1. In this case, the thermal noise and the power consumption of the operational amplifier can be reduced optimally by ideally setting the corner frequency fcr to be fcr=f1, as indicated by E3 in FIG. 7A. However, when setting the corner frequency fcr to be fcr=f1, the thermal noise level may exceed the desired noise level when process variation occurs.

In FIG. 6B, the first-type operational amplifier OP1 is designed so that the relationship f1-fcr<fcr-f2 is satisfied, thereby causing the corner frequency fcr to be close to the frequency f1 as much as possible. This makes it possible to reduce the thermal noise and the power consumption of the operational amplifier while taking process variation into consideration.

In the second-type operational amplifier OP2 shown in FIG. 7B, when the corner frequency fcr is set at a position indicated by E4, the noise at the frequency f2 increases, whereby flicker noise cannot be effectively reduced. On the other hand, when the corner frequency fcr is set at a position indicated by E5, the WL product W1×L1 unnecessarily increases, thereby hindering a reduction in circuit area.

In this embodiment, the transistors of the second-type operational amplifier OP2 are sized so that the corner frequency fcr is set near the frequency f2. In this case, the flicker noise and the layout area of the operational amplifier can be reduced optimally by ideally setting the corner frequency fcr to be fcr=f2, as indicated by E6 in FIG. 7B. However, when setting the corner frequency fcr to be fcr=f2, the flicker noise level may exceed the desired noise level when process variation occurs.

In FIG. 6C, the second-type operational amplifier OP2 is designed so that the relationship fcr-f2<f1-fcr is satisfied, thereby causing the corner frequency fcr to be close to the frequency f2 as much as possible. This makes it possible to reduce the thermal noise and the area of the operational amplifier while taking process variation into consideration.

2.4 Effective Gate Voltage

As shown in FIG. 5C and the equation (10), flicker noise can be reduced by increasing the WL product W1b×L1b of the differential-stage transistor as much as possible and reducing the channel length L1b as much as possible. Therefore, it is considered that flicker noise can be efficiently reduced by sizing the transistors so that the WL ratio W1b/L1b is increased.

However, it was found that an effective gate voltage Veff decreases when increasing the WL ratio W1b/L1b to a large extent, thereby resulting in an increase in flicker noise. The effective gate voltage Veff is expressed by the following equation (17).

$$Veff = Vgs - Vth \qquad (17)$$
$$= \left\{ \frac{2 \times Ids}{\mu \times C_{ox} \times RT1b} \right\}^{\frac{1}{2}}$$

Where, Vgs represents the gate-source voltage of the transistor, Vth represents the threshold voltage, Ids represents the drain-source current, μ represents the mobility, Cox represents the gate capacitance per unit area, and RT1b represents the WL ratio of the differential-stage transistor, provided that RT1b=W1b/L1b.

Figure 8A:
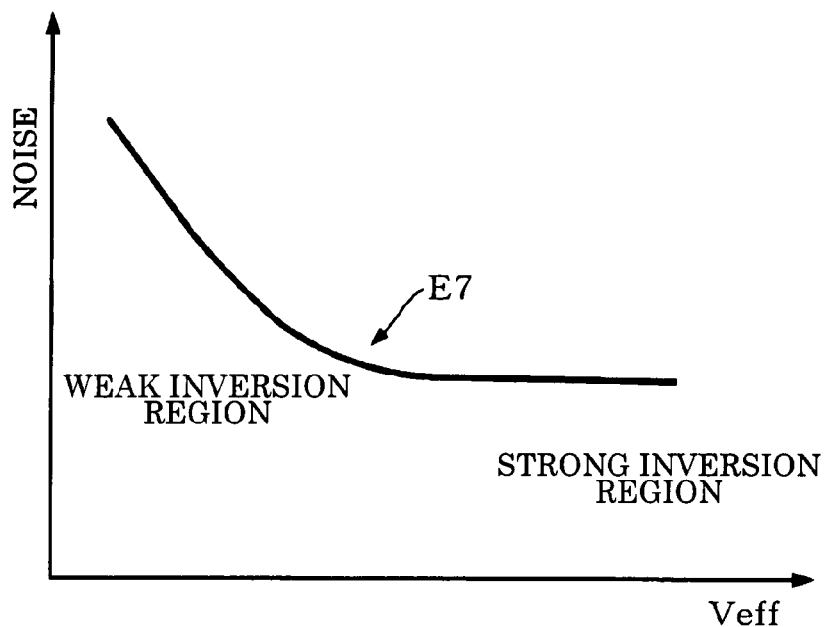
FIGS. 8A and 8B are views illustrative of the relationship between an effective gate voltage and noise.
Figure 8B:
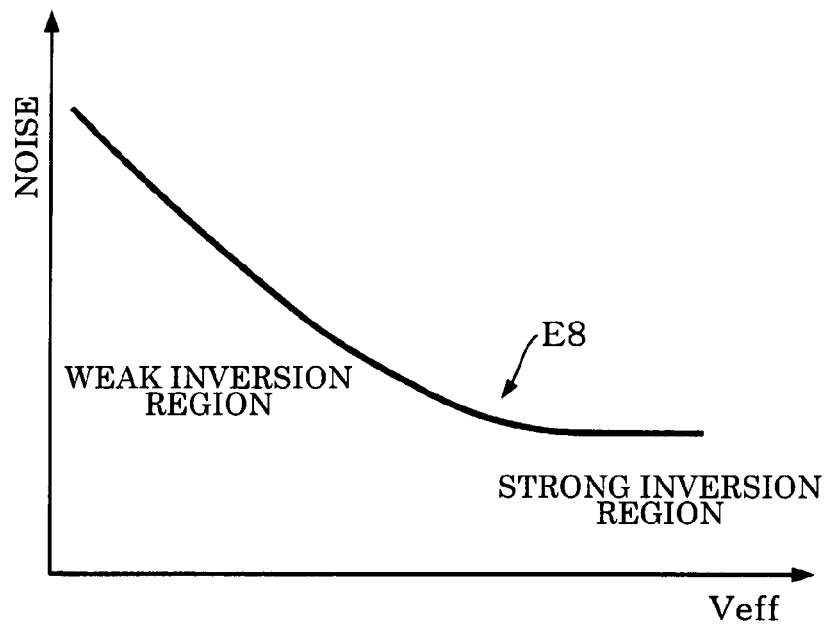

FIGS. 8A and 8B show measurement results of the relationship between the effective gate voltage Veff and noise (noise level Svg), for example. FIG. 8A shows an example of an N-type transistor, and FIG. 8B shows an example of a P-type transistor. In FIGS. 8A and 8B, the effective gate voltage Veff is changed by changing the noise level Vgs. Note that the drain-source voltage Vds is equal to the gate-source voltage Vgs.

As indicated by E7 in FIGS. 8A and E8 in FIG. 8B, noise increases steeply when the effective gate voltage Veff decreases. This occurs due to a phenomenon in which the transistor operates in a weak inversion region when the effective gate voltage Veff as the small-signal reference voltage decreases, whereby flicker noise increases rapidly. In FIGS. 8A and 8B, flicker noise increases rapidly at an effective gate voltage Veff of 10 mV to 100 mV, for example. Therefore, in order to suppress an increase in flicker noise due to the operation in the weak inversion region, it is desirable to increase the effective gate voltage Veff to a value greater than 10 mV to 100 mV.

Figure 9A:
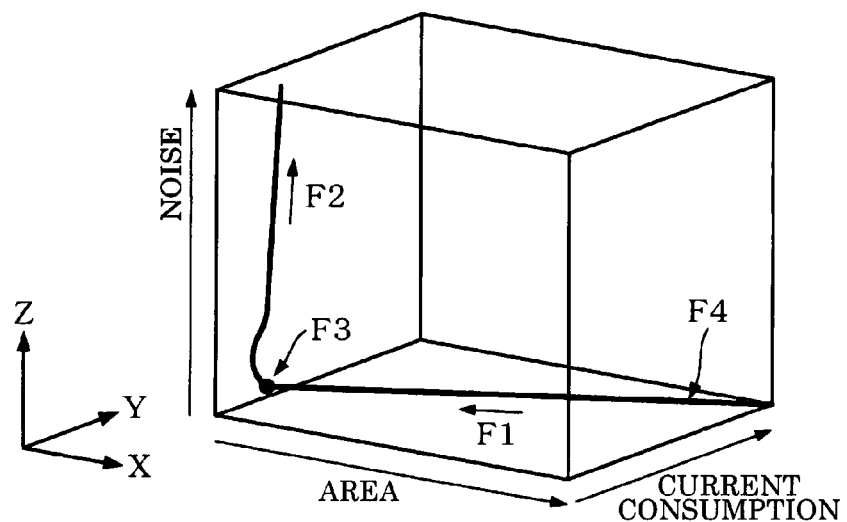
FIGS. 9A and 9B are views illustrative of simulation results according to one embodiment of the invention.

FIG. 9A provides simulation results showing the relationship among the area, current consumption, and noise of the operational amplifier when changing the effective gate voltage Veff, wherein the X axis indicates the area (the length of one side when the operational amplifier is square), the Y axis indicates the current consumption, and the Z axis indicates the noise level.

In FIG. 9A, the effective gate voltage Veff is changed by changing the WL ratio RT1$b$=W1$b$/L1$b$ under conditions where the WL product W1$b$×L1$b$ is constant. For example, the directions indicated by arrows F1 and F2 in FIG. 9A are directions in which the effective gate voltage Veff decreases. The effective gate voltage Veff is reduced by increasing the WL ratio RT1$b$=W1$b$/L1$b$.

As indicated by F7 in FIG. 9A, the area and the current consumption of the operational amplifier decrease as the effective gate voltage Veff decreases. On the other hand, the noise changes to only a small extent.

However, the noise increases rapidly at the point F3 in FIG. 9A. Specifically, when the WL ratio RT1$b$=W1$b$/L1$b$ exceeds a specific value, the transistor operates in the weak inversion region, as described with reference to FIGS. 8A and 8B, whereby flicker noise increases rapidly so that the noise of the operational amplifier increases rapidly.

At a point F4 in FIG. 9A, since the area and the current consumption of the operational amplifier are large although the noise is small, the area and the current are uselessly consumed.

In this embodiment, the WL ratio RT1$b$=W1$b$/L1$b$ of the differential-stage transistor is determined (the range is narrowed) so that the WL ratio RT1$b$ is set at the point F3 in FIG. 9A. For example, the WL ratio RT1$b$ may be a value in the range of 50 to 200. The transistors of the operational amplifier are sized so that the WL product W1$b$×L1$b$ increases and the channel length ratio L1$b$/L3$b$ decreases as shown in FIG. 5C under conditions where the WL ratio RT1$b$ is determined as described above.

Specifically, the transistor is prevented from operating in the weak inversion region by satisfying the following equation (18).

$$V\!e\!f\!f = \left\{\frac{2 \times Ids}{\mu \times C_{ox} \times RT1b}\right\}^{\frac{1}{2}} > \frac{k \times T}{q} \quad (18)$$

Where, k represents the Boltzmann constant, T represents the absolute temperature, and q (=1.602×10$^{-19}$ coulombs) represents the amount of electronic charge. k×T/q=25.7 mV at room temperature (25°).

On the other hand, since flicker noise increases at the boundary between the weak inversion region and the strong inversion region, as shown in FIGS. 8A and 8B, it is necessary to take process variation into consideration. Therefore, when process variation parameter (process-dependent parameter) is referred to as P (P>1), the following equation (19) is satisfied.

$$P \times \frac{k \times T}{q} > V\!e\!f\!f = \left\{\frac{2 \times Ids}{\mu \times C_{ox} \times RT1b}\right\}^{\frac{1}{2}} > \frac{k \times T}{q} \quad (19)$$

The process variation parameter P may be set at 3.0, for example. The process variation parameter P may be desirably a value in the range of 1.5 to 2.0.

In this embodiment, the WL ratio RT1$b$=W1$b$/L1$b$ of the differential-stage transistor is determined so that the effective gate voltage Veff is a value in the range which satisfies the equation (19). The transistors of the operational amplifier are sized so that the WL product W1$b$×L1$b$ increases and the channel length ratio L1$b$/L3$b$ decreases under conditions where the WL ratio RT1$b$ is determined as described above. It is desirable to again perform a fine adjustment by changing the WL ratio RT1$b$ after determining the WL ratio RT1$b$ and determining the WL product W1$b$×L1$b$ and the channel length ratio L1$b$/L3$b$.

Figure 9B:
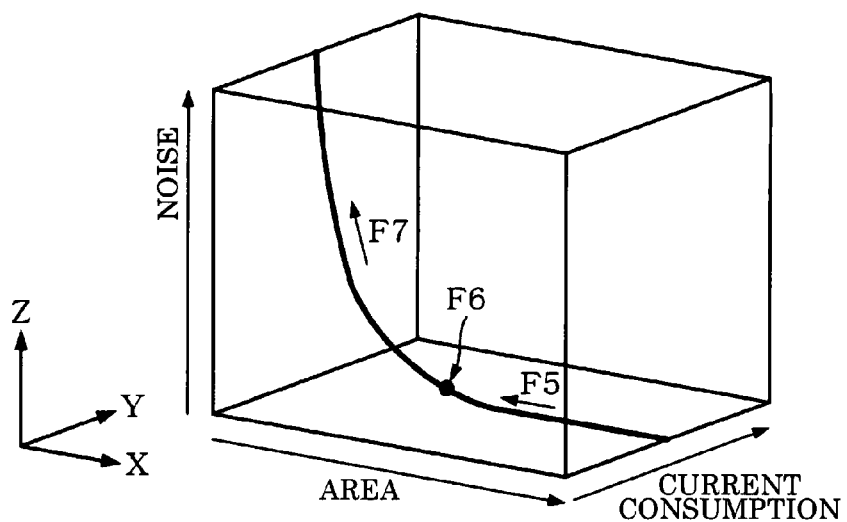

FIG. 9B provides simulation results showing the relationship among the area, current consumption, and noise of the operational amplifier when changing the ratio L1$b$/L3$b$ (L3$b$/L1$b$) which is the ratio of the gate length L1$b$ of the differential-stage transistor and the gate length L3$b$ of the active-load-stage transistor.

When increasing the ratio L1$b$/L3$b$ (reducing the ratio L3$b$/L1$b$), as indicated by F5 in FIG. 9B, noise increases rapidly as indicated by F7 from a point indicated by F6. In this case, the area of the operational amplifier decreases when increasing the ratio L1$b$/L3$b$, but the current consumption changes to only a small extent.

As is clear from the results shown in FIG. 9B, the ratio L1$b$/L3$b$ can be optimally set by setting the ratio L1$b$/L3$b$ at the point indicated by F6. Specifically, the ratio L1$b$/L3$b$ may be a value in the range of 0.4 to 0.8, for example.

According to this embodiment, a reduction in noise, circuit area, and power consumption is successfully achieved in combination by sizing the transistors of the operational amplifier as described above.

Figure 10:
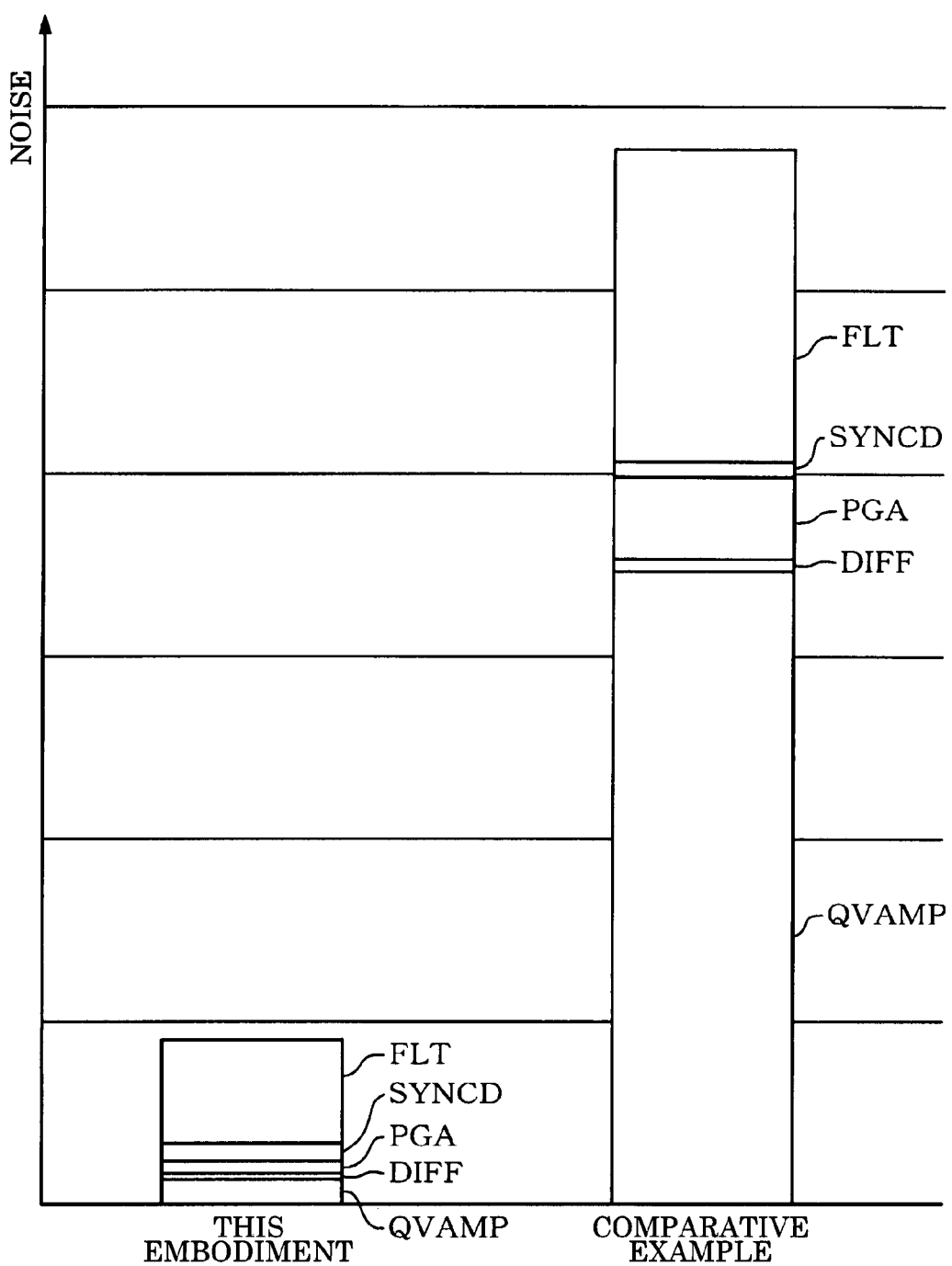
FIG. 10 is a bar graph for comparing one embodiment of the invention and a comparative example in terms of the noise level.

FIG. 10 is a bar graph showing the noise level of each circuit when sizing the transistors of the operational amplifier using the method according to this embodiment and the noise level of each circuit in a comparative example in which sizing using the method according to this embodiment is not performed.

FIG. 10 shows the results when applying the method according to this embodiment to a gyrosensor detection device described later. QVAMP, DIFF, PGA, SYNCD, and FLT respectively indicate the noise levels of a Q/V conversion circuit, a differential amplifier circuit, a sensitivity adjustment circuit, a synchronous detection circuit, and a filter section.

As shown in FIG. 10, this embodiment successfully and efficiently reduces the noise of the entire system by selectively using the operational amplifiers for the AC signal circuits and the DC signal circuits to achieve an optimum low-noise design.

2.5 Layout

A layout method for the first-type and second-type operational amplifiers OP1 and OP2 is described below. FIG. 1A shows a layout example of the first-type operational amplifier OP1, and FIG 11B shows a layout example of the second-type operational amplifier OP2.

In FIG. 1B, H2 indicates the arrangement region of the differential-stage transistors M1 and M2 among the elements (e.g., transistor, capacitor, and resistor) of the second-type operational amplifier OP2. The area of the arrangement region H2 is referred to as Sdf, and the area of the arrangement region of the elements of the second-type operational amplifier other than the differential-stage transistors M1 and M2 is referred to as Sre. Note that the elements other than the differential-stage transistors M1 and M2 refer to the transistors M3, M4, M5, M6, and M7 other than the transistors M1 and M2, the capacitor CF, the resistor RF, and the like shown in FIG. 4B, for example. In FIG. 11B, the relationship Sdf>Sre is satisfied. The WL product W1$b$×L1$b$ can be increased by satisfying such a relationship, whereby flicker noise can be reduced.

Figure 11A:
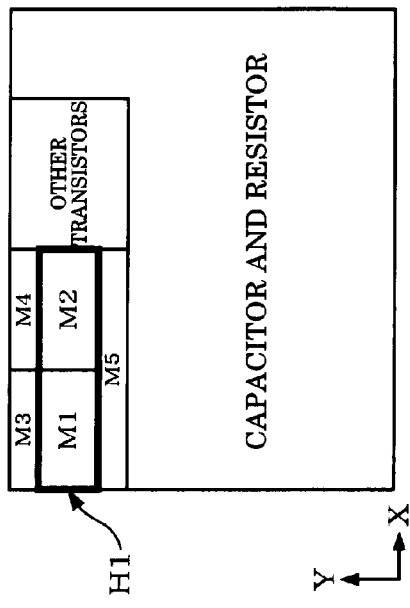
FIGS. 11A and 11B show layout examples of first-type and second-type operational amplifiers.

In the first-type operational amplifier OP1 shown in FIG. 11A, since the arrangement region of the differential-stage transistors M1 and M2 is a small, as indicated by H1, the relationship Sdf>Sre is not satisfied. In the first-type operational amplifier OP1, thermal noise is reduced by sizing the transistors so that the bias current IBD=Ia increases.

Figure 11B:
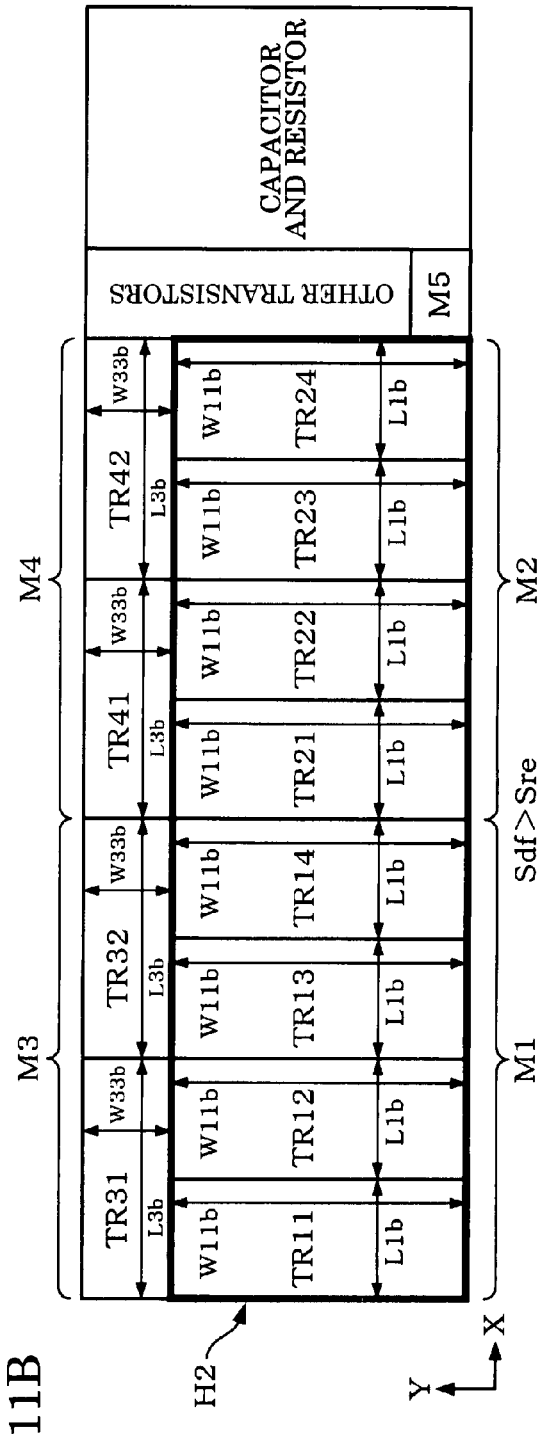

In FIG. 11B, the differential-stage transistor M1 of the second-type operational amplifier OP2 includes (J) transistors TR11, TR12, TR13, and TR14 connected in parallel. Likewise, the differential-stage transistor M2 of the second-type operational amplifier OP2 includes transistors TR21, TR22, TR23, and TR24 connected in parallel. The parallel-connected transistors TR11 to TR14 and TR21 to TR24 are disposed in the arrangement region of the differential-stage transistors M1 and M2 indicated by H2.

In FIG. 11B, a direction X is the channel length direction, and a direction Y is the channel width direction. The channel length of each of the parallel-connected transistors TR11 to TR14 and TR21 to TR24 is L1$b$. When the number of the parallel-connected transistors TR11 to TR14 or TR21 to TR24 is J (J=4 in FIG. 11B), the channel width of each of the transistors TR11 to TR14 and TR21 to TR24 is W11$b$=W1$b$/J. The WL ratio W1$b$/L1$b$ can be increased while increasing the WL product W1$b$×L1$b$ by disposing the parallel-connected transistors TR11 to TR14 and TR21 to TR24 as shown in FIG. 11B, whereby flicker noise can be efficiently reduced.

In FIG. 11B, the active-load-stage transistors M3 and M4 respectively include (I) transistors TR31 and TR32 and (I) transistors TR41 and TR42 connected in parallel. The channel length of each of the parallel-connected transistors TR31 and TR32 and the parallel-connected transistors TR41 and TR42 is L3$b$. When the number of the parallel-connected transistors TR31 and TR32 or TR41 and TR42 is I(1=2 in FIG. 11B), the channel width of each of the transistors TR31 and TR32 and the transistors TR41 and TR42 is W33$b$=W3$b$/I.

In FIG. 11B, the J (e.g., J=4) transistors TR11 to TR14 and the J transistors TR21 to TR24 are disposed in the arrangement region of the differential-stage transistors M1 and M2 in the direction X, and the I (I<J; e.g., 1=2) transistors TR31 and TR32 and the I transistors TR41 and TR42 are disposed in the arrangement region of the active-load-stage transistors M3 and M4 in the direction X. This enables the transistors TR11 to TR14 and the transistors TR21 to TR24 respectively forming the differential-stage transistors M1 and M2 and the transistors TR31 and TR32 and the transistors TR41 and TR42 respectively forming the active-load-stage transistors M3 and M4 to be efficiently disposed symmetrically in the rectangular arrangement region while satisfying the relationship L1$b$<L3$b$ described with reference to FIG. 5C. This increases layout efficiency.

Figure 12:
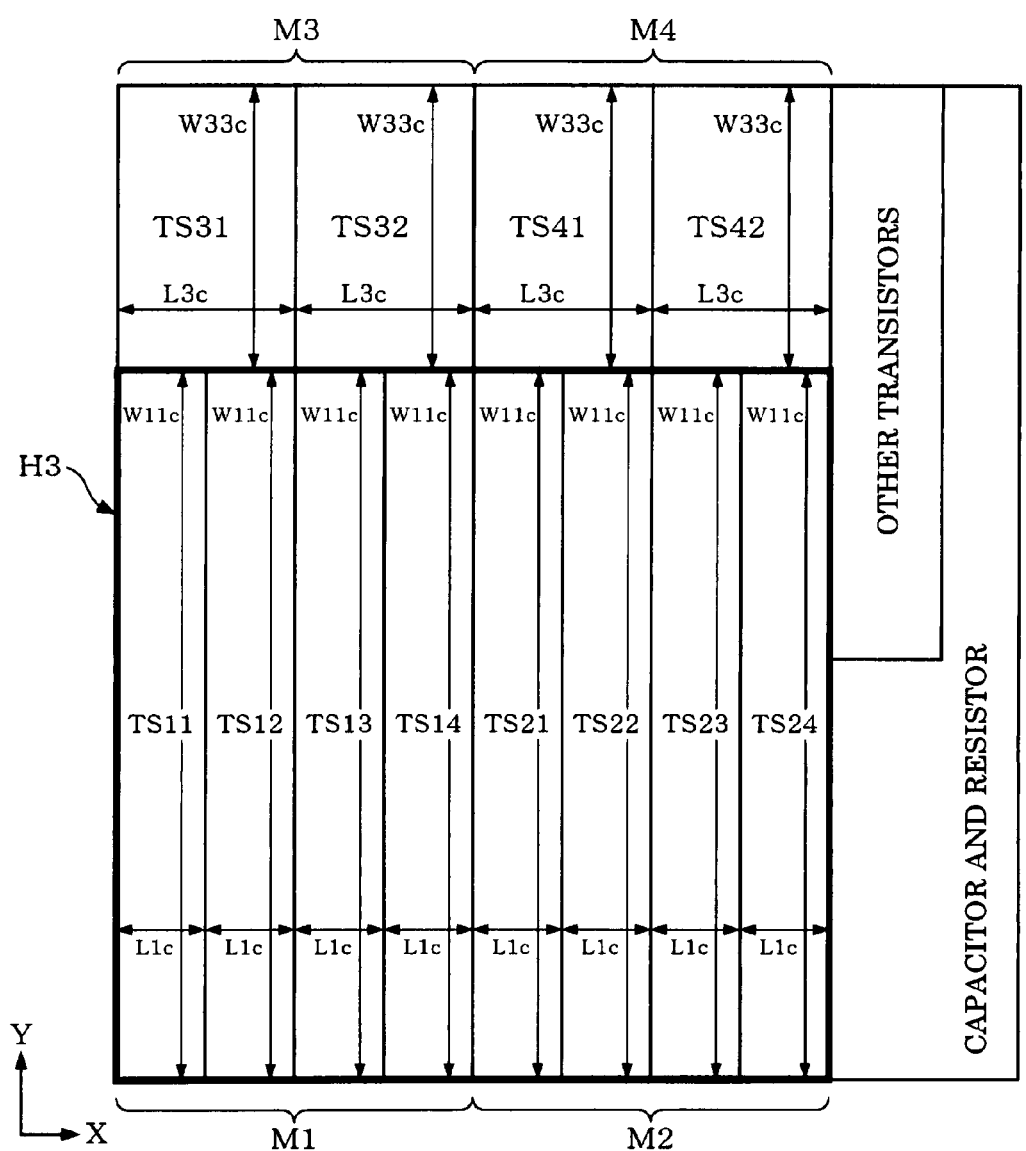
FIG. 12 shows a layout example of a third-type operational amplifier.

FIG. 12 shows a layout example of the third-type operational amplifier OP3. In FIG. 12, H3 indicates the arrangement region of the differential-stage transistors M1 and M2. In FIG. 12, since the relationship Sdf>Sre is satisfied in the same manner as in FIG. 11B, the WL ratio W1$c$/L1$c$ can be increased. Therefore, flicker noise can be reduced.

In FIG. 12, the differential-stage transistors M1 and M2 respectively include parallel-connected transistors TS11 to TS14 and parallel-connected transistors TS21 to TS24. The (J) parallel-connected transistors TS11 to TS14 and the (J) parallel-connected transistors TS21 to TS24 are disposed in the arrangement region of the differential-stage transistors M1 and M2 indicated by H3.

The channel length of each of the parallel-connected transistors TS11 to TS14 and the parallel-connected transistors TS21 to TS24 is L1$c$, and the channel width is W11$c$=W1$c$/J.

As is clear from the comparison between FIG. 12 and FIG. 11B, the arrangement region H3 of the differential-stage transistors M1 and M2 of the third-type operational amplifier OP3 shown in FIG. 12 is further increased as compared with FIG. 11B. This realizes an operational amplifier which can further reduce flicker noise as compared with FIG. 11B.

3. Modification

Figure 13:
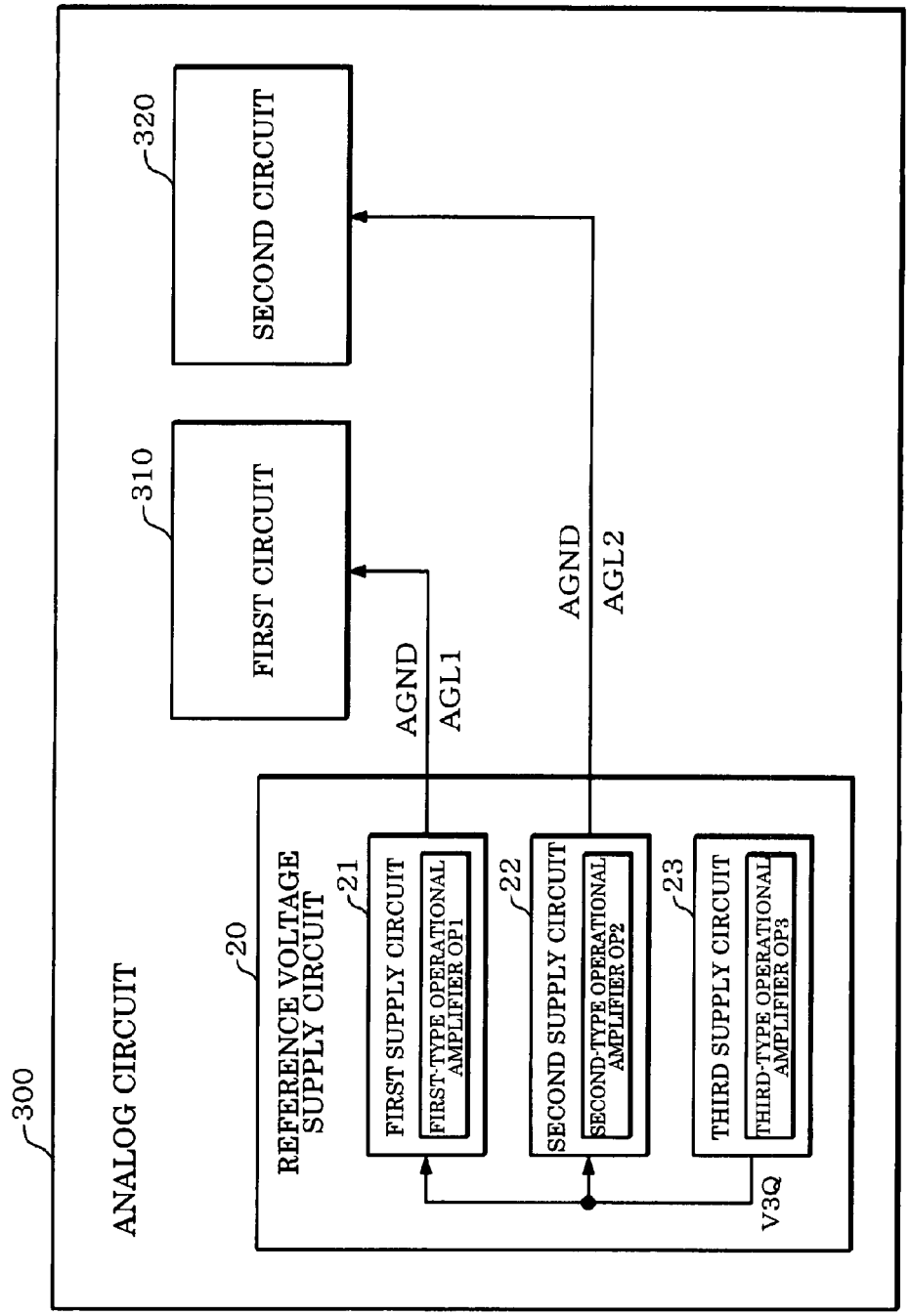
FIG. 13 shows a modification according to one embodiment of the invention.

FIG. 13 shows a modification of this embodiment. In FIG. 13, a reference voltage supply circuit 20 is additionally provided in the configuration shown in FIG. 1.

The reference voltage supply circuit 20 supplies the voltage AGND (analog reference voltage in a broad sense) to the first circuit 310. The voltage AGND (analog ground) is a voltage used as a reference for the analog circuit. The signal amplification operation of the operational amplifier is performed based on the voltage AGND. Accordingly, the reference voltage supply circuit 20 must supply the voltage AGND at a stable potential to the first circuit 310.

The reference voltage supply circuit 20 includes a first supply circuit 21 and a second supply circuit 22. The first supply circuit 21 supplies the voltage AGND (analog reference voltage) to the first circuit 310. The second supply circuit 22 supplies the voltage AGND to the second circuit 320. The first supply circuit 21 includes a reference-voltage first-type operational amplifier OP1, and the second supply circuit 22 includes a reference-voltage second-type operational amplifier OP2.

The channel width and the channel length of the differential-stage transistor of the differential section of the reference-voltage first-type operational amplifier OP1 are respectively referred to as W1$d$ and L1$d$, and the bias current flowing through the differential section is referred to as Id. The channel width and the channel length of the differential-stage transistor of the differential section of the reference-voltage second-type operational amplifier OP2 are respectively referred to as W1$e$ and L1$e$, and the bias current flowing through the differential section is referred to as Ie. In this case, the relationship W1$e$×L1$e$>W1$d$×L1$d$ and Id>Ie is satisfied.

Specifically, the transistors of the reference-voltage first-type operational amplifier OP1 are sized in the same manner as in the first-type operational amplifier included in the first circuit 310 described with reference to FIGS. 4A to 12. The transistors of the reference-voltage second-type operational amplifier OP2 are sized in the same manner as in the second-type operational amplifier included in the second circuit 320 described with reference to FIGS. 4A to 12. Specifically, the transistors of the reference-voltage first-type operational amplifier OP1 may be sized so that W1d=W1a and L1d=L1a. The transistors of the reference-voltage second-type operational amplifier OP2 may be sized so that W1e=W1b and L1e=L1b. This also applies to sizing of the active-load-stage transistor.

For example, the frequency f1 of the amplification target signal of the first circuit 310 which operates based on the voltage AGND supplied from the first supply circuit 21 is high, as shown in FIG. 5A, and thermal noise predominantly occurs at the frequency f1, as described above. Therefore, even if the first circuit 310 is formed of the first-type operational amplifier, thermal noise of the first circuit 310 increases when thermal noise is superimposed on the voltage AGND.

In FIG. 13, the first supply circuit 21 includes the reference-voltage first-type operational amplifier OP1, and supplies the voltage AGND using the reference-voltage first-type operational amplifier OP1. The reference-voltage first-type operational amplifier OP1 is an operational amplifier mainly designed to reduce thermal noise, as described with reference to FIG. 5C and the like. Therefore, thermal noise superimposed on an AGND line AGL1 can be minimized, whereby an increase in thermal noise in the first circuit 310 can be prevented.

The frequency f2 of the amplification target signal of the second circuit 320 which operates based on the voltage AGND supplied from the second supply circuit 22 is low, as shown in FIG. 5A, and flicker noise predominantly occurs at the frequency f2, as described above. Therefore, even if the second circuit 320 is formed of the second-type operational amplifier, flicker noise of the second circuit 320 increases when flicker noise is superimposed on the voltage AGND.

In FIG. 13, the second supply circuit 22 includes the reference-voltage second-type operational amplifier OP2, and supplies the voltage AGND using the reference-voltage second-type operational amplifier OP2. The reference-voltage second-type operational amplifier OP2 is an operational amplifier mainly designed to reduce flicker noise, as described with reference to FIG. 5C and the like. Therefore, flicker noise superimposed on an AGND line AGL2 can be minimized, whereby an increase in flicker noise in the second circuit 320 can be prevented.

The voltage AGND from the first supply circuit 21 is supplied through the AGND line AGL1 (first analog reference voltage line in a broad sense). The voltage AGND from the second supply circuit 22 is supplied through the AGND line AGL2 (second analog reference voltage line in a broad sense). In this case, the AGND lines AGL1 and AGL2 are separately provided from the reference voltage supply circuit 20 to the first and second circuits 310 and 320. Specifically, the two AGND lines AGL1 and AGL2 are connected with the first and second circuits 310 and 320 while being separated in the layout. This prevents a situation in which noise from the AGND line AGL1 is transmitted to the AGND line AGL2 or noise from the AGND line AGL2 is transmitted to the AGND line AGL1.

For example, when thermal noise from the AGND line AGL2 is transmitted to the AGND line AGL1, the thermal noise from the AGND line AGL2 is transmitted to the first circuit 310, even if the first supply circuit 21 is formed using the first-type operational amplifier OP1 mainly designed to reduce thermal noise, whereby the SNR deteriorates. Likewise, when flicker noise from the AGND line AGL2 is transmitted to the AGND line AGL2, the flicker noise from the AGL1 is transmitted to the second circuit 320, even if the second supply circuit 22 is formed using the second-type operational amplifier OP2 mainly designed to reduce flicker noise, whereby the SNR deteriorates.

The above-described situation can be prevented by separately providing the AGND lines AGL1 and AGL2, as shown in FIG. 13, whereby the SNR of the entire system can be increased.

Figure 14:
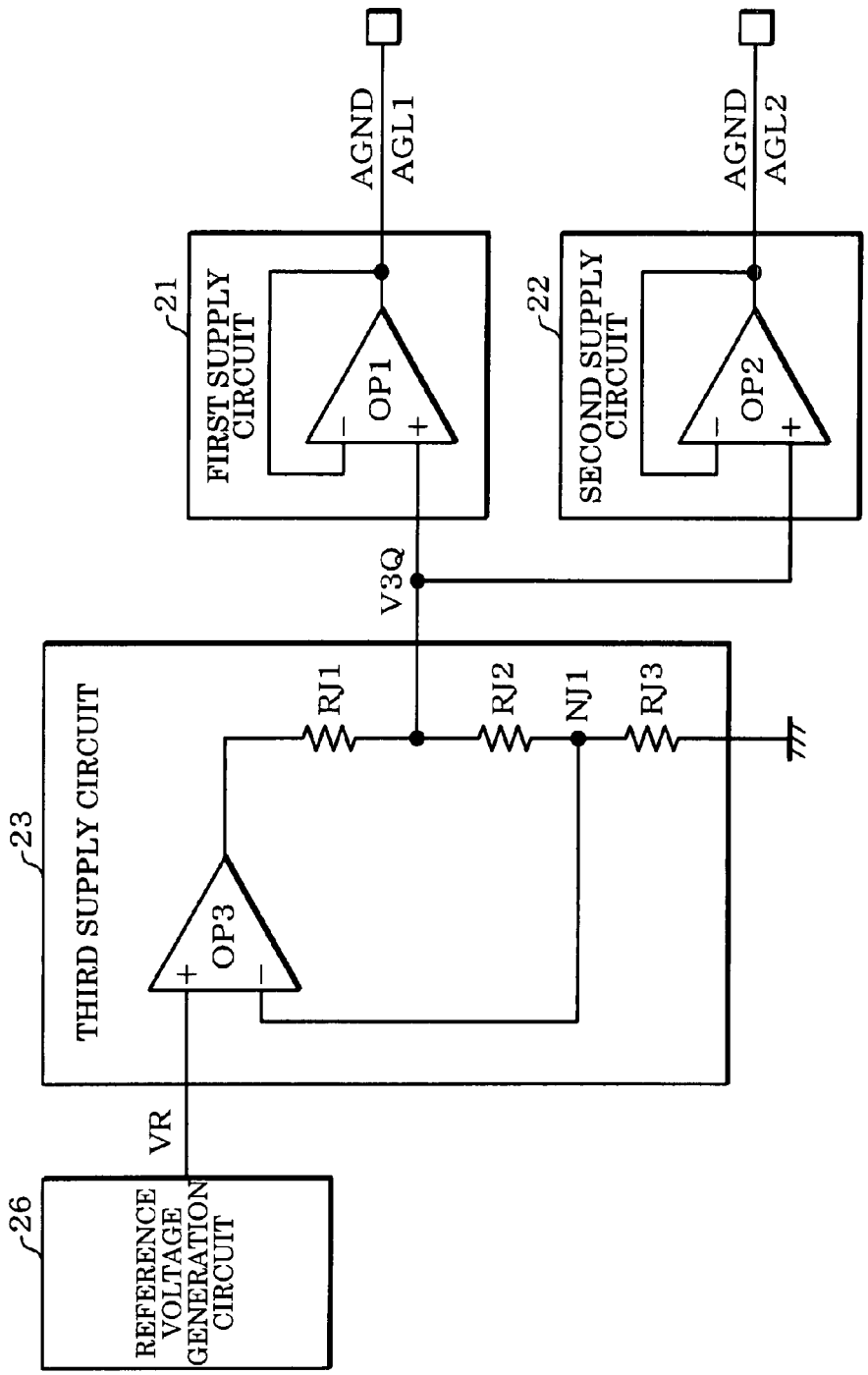
FIG. 14 shows a detailed configuration example of a reference voltage supply circuit.

FIG. 14 shows a detailed configuration example of the reference voltage supply circuit 20. The reference voltage supply circuit 20 is not limited to the configuration shown in FIG. 14. Various modification may be made such as omitting some elements or adding another element.

The reference voltage supply circuit 20 includes first, second, and third supply circuits 21, 22, and 23. The reference voltage supply circuit 20 also includes a reference voltage generation circuit 26.

The first supply circuit 21 (first impedance conversion circuit) performs voltage impedance conversion using a reference-voltage first-type operational amplifier OP1, for example. Specifically, the first-type operational amplifier OP1 included in the first supply circuit 21 is a voltage-follower-connected operational amplifier of which the inverting input terminal (second input terminal in a broad sense) is connected with the output terminal. The output terminal of the first-type operational amplifier OP1 is connected with the AGND line AGL1.

The second supply circuit 22 (second impedance conversion circuit) performs voltage impedance conversion using a reference-voltage second-type operational amplifier OP2, for example. Specifically, the second-type operational amplifier OP2 included in the second supply circuit 22 is a voltage-follower-connected operational amplifier of which the inverting input terminal (second input terminal) is connected with the output terminal. The output terminal of the second-type operational amplifier OP2 is connected with the AGND line AGL2.

The third supply circuit 23 is provided in the preceding stage of the first and second supply circuits 21 and 22, and supplies a voltage V3Q to the first and second supply circuits 21 and 22. The first and second supply circuits 21 and 22 subject the output voltage V3Q from the third supply circuit 23 to impedance conversion and outputs the voltage AGND.

The third supply circuit 23 includes a third-type operational amplifier OP3 described with reference to FIGS. 5C and 12. The third supply circuit 23 may include a voltage divider circuit including resistors RJ1, RJ2, and RJ3.

The reference voltage generation circuit 26 generates a reference voltage VR for generating the voltage AGND. A circuit which generates the reference voltage VR by a band gap may be employed as the reference voltage generation circuit 26, for example.

In FIG. 14, the voltage of a node NJ1 is equal to the reference voltage VR due to a virtual short circuit of the third-type operational amplifier OP3, for example. Therefore, when the resistances of the resistors RJ2 and RJ3 are respectively referred to as R2 and R3, the output voltage of the third supply circuit 23 is V3Q=VR×{(R2+R3)/R3}. The first and second supply circuits 21 and 22 subject the output voltage V3Q (=AGND=VR×{(R2+R3)/R3}) to impedance conversion. This enables the potential of the voltage AGND to be stabilized.

The channel width and the channel length of the differential-stage transistor of the differential section of the reference-voltage third-type operational amplifier OP3 are respectively referred to as $W1f$ and $L1f$, and the bias current flowing through the differential section is referred to as If. In this case, the relationship $W1f \times L1f > W1d \times L1d$ and If>Ie is satisfied.

Specifically, the transistors of the reference-voltage third-type operational amplifier OP3 are sized in the same manner as in the third-type operational amplifier included in the mixer 322 described with reference to FIGS. 4A to 12. Specifically, the differential-stage transistors of the reference-voltage third-type operational amplifier OP3 may be sized so that W1f=W1c and L1f=L1c, for example. This also applies to sizing of the active-load-stage transistor.

For example, the first supply circuit 21 receives the output voltage V3Q from the third supply circuit 23, and supplies the voltage AGND to the first circuit 310. Therefore, when thermal noise is superimposed on the output voltage V3Q of the third supply circuit 23, the thermal noise superimposed on the output voltage V3Q is transmitted to the first circuit 310, even if the first-type operational amplifier OP1 mainly designed to reduce thermal noise is used as the first supply circuit 21. As a result, the SNR of the entire system deteriorates.

The second supply circuit 22 receives the output voltage V3Q from the third supply circuit 23, and supplies the voltage AGND to the second circuit 320. Therefore, when flicker noise is superimposed on the output voltage V3Q of the third supply circuit 23, the flicker noise superimposed on the output voltage V3Q is transmitted to the second circuit 320, even if the second-type operational amplifier OP2 mainly designed to reduce flicker noise is used as the second supply circuit 22. As a result, the SNR of the entire system deteriorates.

The third-type operational amplifier OP3 of the third supply circuit 23 shown in FIG. 14 satisfies the relationship W1f×L1f>W1d×L1d and If>Ie (W1c×L1c>W1a×L1a and Ic>Ib). The third-type operational amplifier OP3 preferably satisfies the relationship W1f×L1f>W1e×L1e and If>Id (W1c×L1c>W1b×L1b and Ic>Ia). Therefore, the third-type operational amplifier OP3 is an operational amplifier with low thermal noise and low flicker noise. For example, the third-type operational amplifier OP3 has a large WL product and a large bias current, as shown in the layout example in FIG. 12. Therefore, the third-type operational amplifier OP3 is an operational amplifier with very low thermal noise and very low flicker noise.

As described above, thermal noise and flicker noise superimposed on the output voltage V3Q of the third supply circuit 23 can be minimized using the third-type operational amplifier OP3 with low thermal noise and low flicker noise as the third supply circuit 23. Therefore, a situation can be minimized in which thermal noise superimposed on the output voltage V3Q is transmitted to the first circuit 310 through the first supply circuit 21 or flicker noise superimposed on the output voltage V3Q is transmitted to the second circuit 320 through the second supply circuit 22, whereby the SNR of the entire system can be significantly increased.

4. Gyrosensor Detection Device

Figure 15:
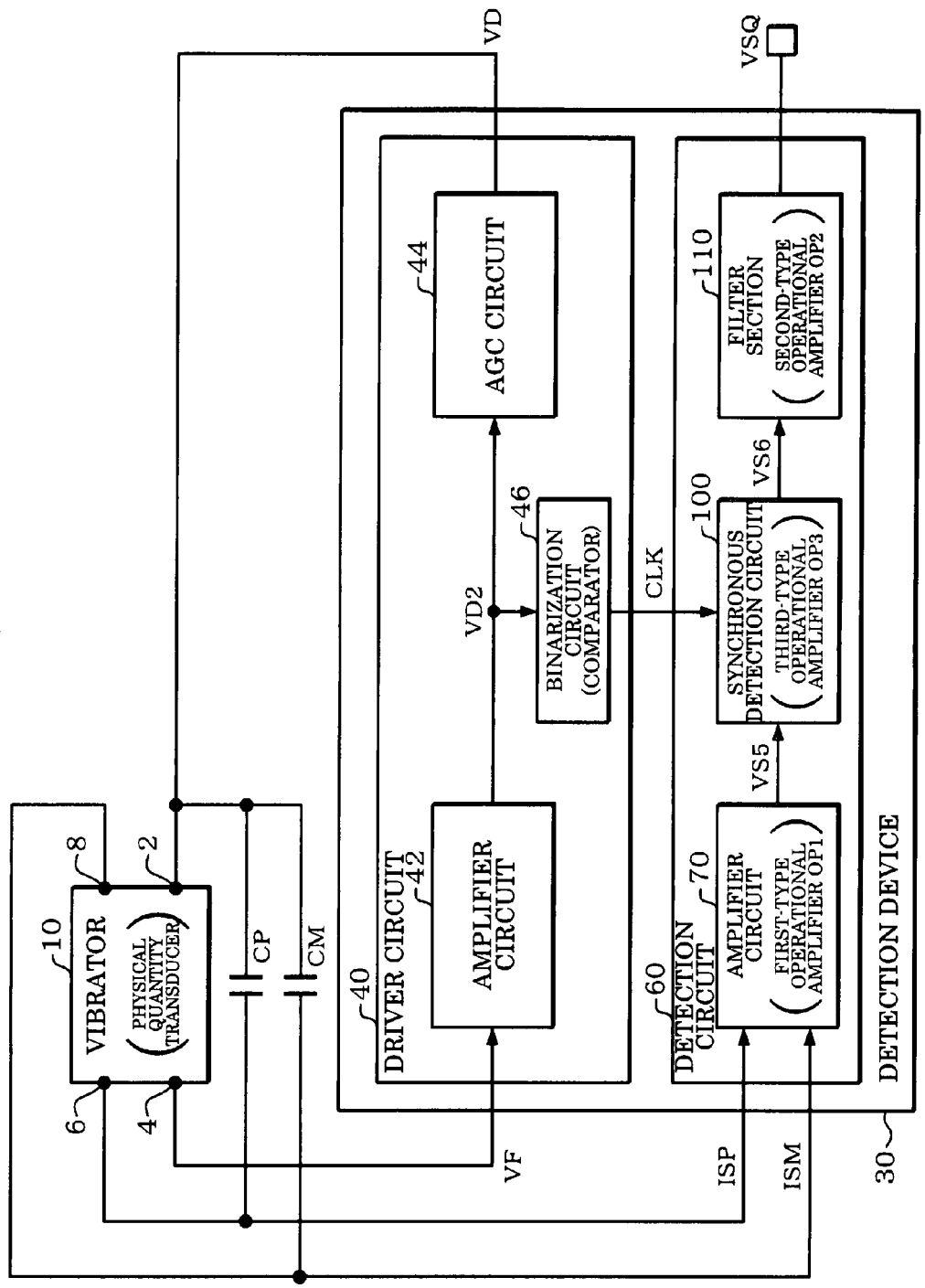
FIG. 15 shows a configuration example of a gyrosensor detection device.

A case of applying the method according to this embodiment to a gyrosensor detection device is described below. FIG. 15 shows a configuration example of a detection device 30. The detection device 30 includes a driver circuit 40 and a detection circuit 60. The detection device 30 is not limited to the configuration shown in FIG. 15. Various modification may be made such as omitting some elements or adding another element. For example, the configuration of the driver circuit 40 may be omitted when a synchronization signal can be extracted based on a detection signal from a vibrator 10.

Figure 16A:
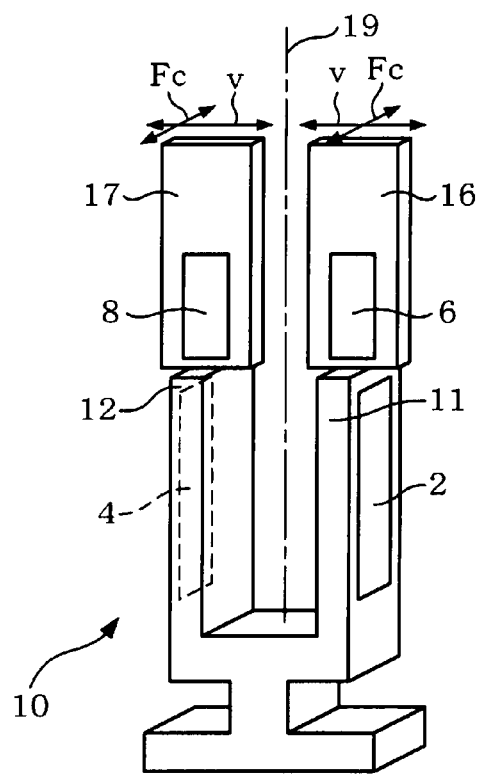
FIGS. 16A and 16B are views illustrative of a vibrator.

The vibrator 10 (vibrating gyroscope) as a physical quantity transducer is a piezoelectric vibrator formed of a piezoelectric material such as a crystal. FIG. 16A shows a tuning-fork piezoelectric vibrator as an example of the vibrator 10. The vibrator 10 includes driving vibrators 11 and 12 and detection vibrators 16 and 17. The driving vibrators 11 and 12 are respectively provided with driving terminals 2 and 4, and the detection vibrators 16 and 17 are respectively provided with detection terminals 6 and 8. FIG. 16A shows an example in which the vibrator 10 is a tuning-fork vibrator. Note that the vibrator 10 according to this embodiment is not limited to the structure shown in FIG. 16A. For example, the vibrator 10 may be a T-shaped vibrator, double-T-shaped vibrator, or the like. The piezoelectric material for the vibrator 10 may be a material other than a crystal. The vibrator 10 (physical quantity transducer) may be an electrostatic micro electro mechanical system (MEMS) which performs a driving/detection operation utilizing capacitance. The physical quantity transducer is an element for converting a physical quantity (indicating the degree of property of an object and expressed in defined units) into another physical quantity. As the conversion target physical quantity, a force such as Coriolis force and gravity, acceleration, mass, and the like can be given. A physical quantity obtained by conversion may be a voltage or the like in addition to current (charge).

The driver circuit 40 outputs a driving signal (driving voltage) VD to drive the vibrator 10 (physical quantity transducer in a broad sense), and receives a feedback signal VF from the vibrator 10. The driver circuit 40 thus causes the vibrator 10 to vibrate. The detection circuit 60 receives detection signals (detection current or charge) ISP and ISM from the vibrator 10 driven by the driving signal VD, and detects (extracts) a desired signal (Coriolis force signal) from the detection signals.

Specifically, the alternating-current driving signal (driving voltage) VD from the driver circuit 40 is applied to the driving terminal 2 of the driving vibrator 11 shown in FIG. 16A. This causes the driving vibrator 11 to start to vibrate due to the reverse voltage effect, and the driving vibrator 12 also starts to vibrate due to the tuning-fork vibration. A current (charge) generated by the piezoelectric effect of the driving vibrator 12 is fed back to the driver circuit 40 from the driving terminal 4 as the feedback signal VF. An oscillation loop including the vibrator 10 is thus formed.

When the driving vibrators 11 and 12 vibrate, the detection vibrators 16 and 17 vibrate in the directions shown in FIG. 16A at a vibration velocity v. A current (charge) generated by the piezoelectric effect of the detection vibrators 16 and 17 is output from the detection terminals 6 and 8 as the detection signals ISP and ISM. The detection circuit 60 receives the detection signals ISP and ISM, and detects the desired signal (desired wave) which is the signal corresponding to the Coriolis force.

Figure 16B:
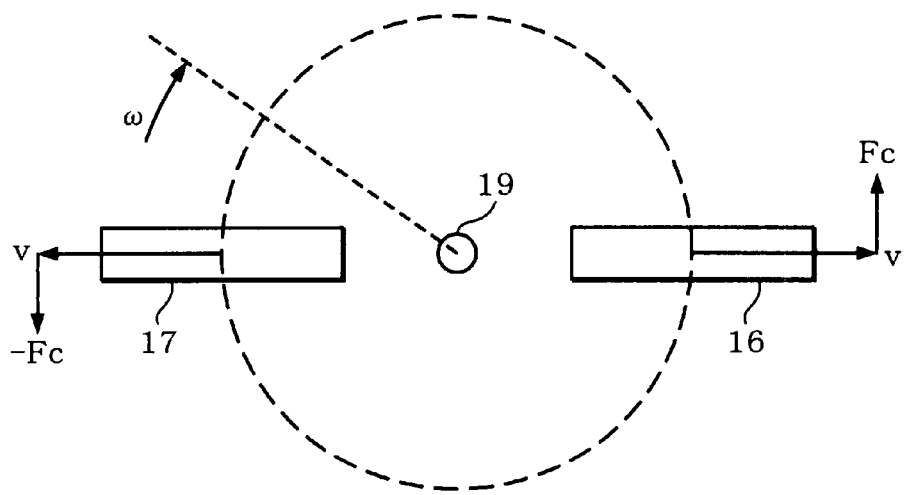

Specifically, when the vibrator 10 (gyrosensor) rotates around a detection axis 19 shown in FIG. 16A, a Coriolis force Fc occurs in the directions perpendicular to the vibration directions at the vibration velocity v. FIG. 16B schematically shows the detection axis 19 shown in FIG. 16A viewed from the upper side. In FIG. 16B, when the angular velocity of the vibrator while the vibrator rotates around the detection axis 19 is referred to as ω, the mass of the vibrator is referred to as m, and the vibration velocity of the vibrator is referred to as v, the Coriolis force is expressed as Fc=2m·v·ω. Therefore, the rotation angular velocity ω of the gyrosensor (vibrator) can be determined by causing the detection circuit 60 to detect (extract) the desired signal which is the signal corresponding to the Coriolis force.

The vibrator 10 has a driving-side resonance frequency fd and a detection-side resonance frequency fs. Specifically, the natural resonance frequency (natural resonance frequency in driving vibration mode) of the driving vibrators 11 and 12 is the frequency fd, and the natural resonance frequency (natural resonance frequency in detection vibration mode) of the detection vibrators 16 and 17 is the frequency fs. In this case, a constant frequency difference is provided between the frequencies fd and fs in a range so that the driving vibrators 11 and 12 and the detection vibrators 16 and 17 can perform the detection operation and have an appropriate intermode coupling which does not cause unnecessary resonant coupling. A detuning frequency Δf=|fd−fs| which is the above difference in frequency is set at a value sufficiently lower than the frequencies fd and fs.

The driver circuit (oscillation circuit) 40 includes an amplifier circuit 42, an automatic gain control (AGC) circuit 44 which performs automatic gain control, and a binarization circuit (comparator) 46. The driver circuit 40 must maintain a constant amplitude of the driving voltage supplied to the vibrator 10 (driving vibrator) in order to maintain constant sensitivity of the gyrosensor. Therefore, the AGC circuit 44 for automatic gain adjustment is provided in the oscillation loop of the driving vibration system. Specifically, the AGC circuit 44 variably and automatically adjusts the gain so that the amplitude of the feedback signal FD (vibration velocity v of the vibrator) becomes constant. Note that the phase is adjusted so that the phase shift in the oscillation loop becomes zero degrees (0 deg). In order to enable high-speed oscillation startup, the gain in the oscillation loop is set at a value larger than unity during oscillation startup.

The amplifier circuit 42 amplifies the feedback signal FD from the vibrator 10. Specifically, an I/V conversion circuit included in the amplifier circuit 42 converts a current (charge) as the feedback signal FD from the vibrator 10 into voltage, and outputs the voltage as a driving signal VD2.

The AGC circuit 44 monitors the driving-side amplified signal VD2 which is the signal amplified by the driving-side amplifier circuit 42, and controls the gain in the oscillation loop. The AGC circuit 44 may include a gain control amplifier (GCA) for controlling the oscillation amplitude in the oscillation loop, and a gain control circuit which outputs a control voltage for adjusting the gain of the gain control amplifier corresponding to the oscillation amplitude. The gain control circuit may include a rectifier circuit (full-wave rectifier) which converts the alternating-current driving signal VD2 from the amplifier circuit 42 into a direct-current signal, a circuit which outputs the control voltage corresponding to the difference between the voltage of the direct-current signal from the rectifier circuit and a reference voltage, and the like.

The binarization circuit 46 binarizes the driving-side amplified signal VD2 which is a sine wave, and outputs a synchronization signal (reference signal) CLK obtained by binarization to a synchronous detection circuit 100 of the detection circuit 60. The binarization circuit 46 may be realized by a comparator to which the sine-wave (alternating-current) signal VD2 from the amplifier circuit 42 is input and which outputs the rectangular-wave synchronization signal CLK. Note that another circuit may be provided between the amplifier circuit 42 and the binarization circuit 46 or between the binarization circuit 46 and the synchronous detection circuit 100. For example, a high-pass filter, a phase-shift circuit (phase shifter), or the like may be provided.

The detection circuit 60 includes an amplifier circuit 70, the synchronous detection circuit 100, and a filter section 110. Note that some of these elements may be omitted, or another element may be added.

The amplifier circuit 70 amplifies the detection signals ISP and ISM from the vibrator 10. Specifically, Q/V conversion circuits (I/V conversion circuits) included in the amplifier circuit 70 respectively receive the signals ISP and ISM from the vibrator 10, and convert (amplify) the charge (current) generated by the vibrator 10 into voltage.

The synchronous detection circuit (detection circuit or detector) 100 performs synchronous detection based on the synchronization signal CLK (synchronization clock signal or reference signal). A mechanical vibration leakage unnecessary signal can be removed by synchronous detection.

The filter section 110 provided in the subsequent stage of the synchronous detection circuit 100 filters a signal VS6 obtained by synchronous detection. Specifically, the filter section 110 performs a low-pass filtering process of removing high-frequency components.

The detection signal (sensor signal) from the vibrator 10 includes a desired signal (desired wave) and an unnecessary signal (unnecessary wave) in a mixed state. Since the amplitude of the unnecessary signal is generally about 100 to 500 times the amplitude of the desired signal, a high performance is required for the detection device 30. Examples of the unnecessary signal include an unnecessary signal caused by mechanical vibration leakage, an unnecessary signal caused by electrostatic coupling leakage, an unnecessary signal caused by the detuning frequency Δf, an unnecessary signal caused by the frequency 2 fd (2ωd), an unnecessary signal caused by DC offset, and the like. The unnecessary signal caused by mechanical vibration leakage occurs due to the imbalance of the shape of the vibrator 10 and the like. The unnecessary signal caused by electrostatic coupling leakage occurs when the driving signal VD shown in FIG. 15 leaks into input terminals of the signals ISP and ISM and the like through the parasitic capacitors CP and CM.

FIGS. 17A to 17C show Frequency spectra illustrative of unnecessary signal removal. FIG. 17A shows the frequency spectrum before synchronous detection. As shown in FIG. 17A, an unnecessary signal caused by DC offset exists in the detection signal before synchronous detection in the DC frequency band. An unnecessary signal caused by mechanical vibration leakage and the desired signal exist in the fd frequency band.

FIG. 17B shows the frequency spectrum after synchronous detection. The desired signal in the fd frequency band shown in FIG. 17A appears in the DC and 2 fd frequency bands after synchronous detection, as shown in FIG. 17B. The unnecessary signal (DC offset) in the DC frequency band shown in FIG. 17A appears in the fd frequency band after synchronous detection, as shown in FIG. 17B. The unnecessary signal (mechanical vibration leakage) in the fd frequency band shown in FIG. 17A appears in the 2fd frequency band after synchronous detection, as shown in FIG. 17B.

FIG. 17C shows the frequency spectrum after filtering. The frequency components of the unnecessary signals in the frequency bands of the frequencies fd, 2 fd, and the like can be removed by smoothing (LPF) the signal after synchronous detection using the filter section 110.

In this embodiment, the amplifier circuit 70 includes a first-type operational amplifier OP1, and the filter section 110 includes a second-type operational amplifier OP2.

The first-type operational amplifier OP1 is an operational amplifier of which the thermal noise at the frequency of the carrier signal (e.g., resonance frequency of the vibrator or driving-side resonance frequency) is lower than that of the second-type operational amplifier OP2, for example. The second-type operational amplifier OP2 is an operational amplifier of which the flicker noise at the frequency of the desired signal (e.g., maximum frequency in the frequency band of the desired signal) is lower than that of the first-type operational amplifier OP1.

The first-type operational amplifier OP1 satisfies the relationship f1−fcr<fcr−f2, and the second-type operational amplifier OP2 satisfies the relationship fcr−f2<f1−fcr, as described above. The relationship W1b×L1b>W1a×L1a and Ia>Ib is also satisfied. The synchronous detection circuit 100 may include a third-type operational amplifier OP3, for example. In this case, the relationship W1c×L1c>W1a×L1a and Ic>Ib is satisfied. Alternatively, the relationship W1c×L1c>W1b×L1b and Ic>Ia may be satisfied.

Figure 18:
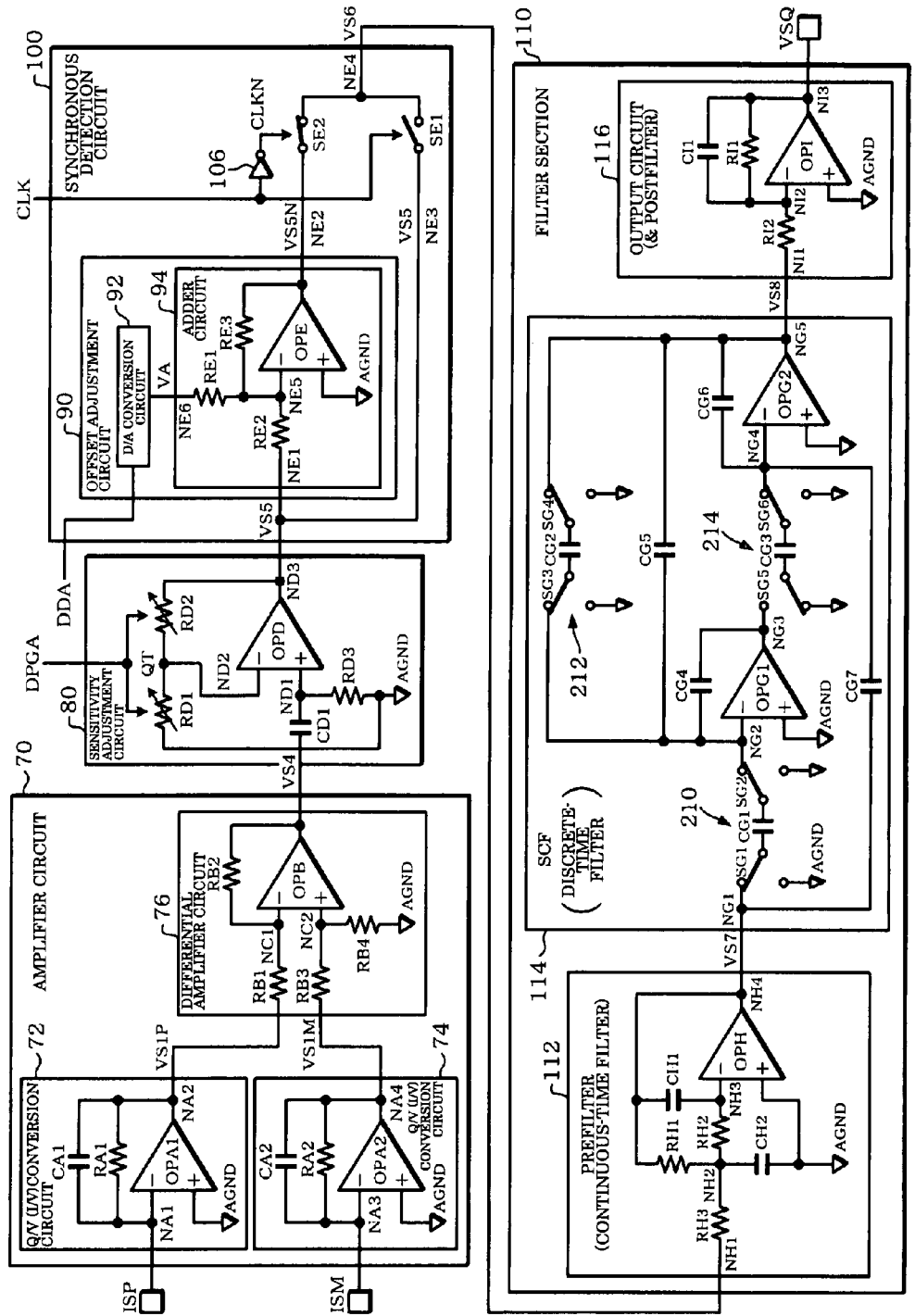
FIG. 18 shows the detailed configuration of a detection device.

FIG. 18 shows a detailed configuration example of the detection circuit 60. The detection circuit 60 shown in FIG. 18 includes the amplifier circuit 70, a sensitivity adjustment circuit 80, the synchronous detection circuit 100, and the filter section 110.

The amplifier circuit 70 includes Q/V conversion circuits 72 and 74 and a differential amplifier circuit 76. The Q/V (I/V) conversion circuits 72 and 74 convert charge (current) generated by the vibrator 10 into voltage. The differential amplifier circuit 76 differentially amplifies output signals VS1P and VS1M from the Q/V conversion circuits 72 and 74.

The Q/V conversion circuit 72 includes a capacitor CA1 and a resistor RA1 provided between nodes NA1 and NA2 and an operational amplifier OPA1, and has low-pass filter frequency characteristics. The input node NA1 is connected with an inverting input terminal (first input terminal) of the operational amplifier OPA1, and the voltage AGND (reference power supply voltage) is connected with a non-inverting input terminal (second input terminal) of the operational amplifier OPA1. The Q/V conversion circuit 74 has the same configuration as the Q/V conversion circuit 72.

The differential amplifier circuit 76 includes resistors RB1, RB2, RB3, and RB4 and an operational amplifier OPB. The differential amplifier circuit 76 amplifies the difference between the input signals VS1P and VS1M with opposite phases by equalizing the resistance ratio of the resistors RB1 and RB2 and the resistance ratio of the resistors RB3 and RB4. Unnecessary signals due to common mode noise, electrostatic coupling leakage, and the like input from the vibrator 10 to the Q/V conversion circuits 72 and 74 can be removed by differential amplification.

In this embodiment, the Q/V conversion circuits 72 and 74 (first and second charge/voltage conversion circuits or first and second current/voltage conversion circuits) and the differential amplifier circuit 76 are formed using the first-type operational amplifiers OP1 described with reference to FIGS. 5C and 11A. Specifically, the first-type operational amplifiers OP1 are used as the operational amplifiers OPA1, OPA2, and OPB shown in FIG. 18.

Specifically, the first-type operational amplifiers OP1 mainly designed to reduce thermal noise are used as the operational amplifiers OPA1, OPA2, and OPB of the Q/V conversion circuits 72 and 74 and the differential amplifier circuit 76 which amplify a signal in a high frequency band (driving-side resonance frequency band) in which thermal noise predominantly occurs. As a result, thermal noise of the Q/V conversion circuits 72 and 74 and the differential amplifier circuit 76 can be minimized, whereby the SNR of the entire system can be increased.

The sensitivity adjustment circuit 80 adjusts the sensitivity (the amount of change in output voltage per unit angular velocity) by variably controlling the gain.

In FIG. 18, the sensitivity adjustment circuit 80 is provided in the preceding stage of the synchronous detection circuit 100. A sensitivity adjustment is performed for the signal having the frequency fd instead of the DC signal by providing the sensitivity adjustment circuit 80 (programmable gain amplifier) in the preceding stage of the synchronous detection circuit 100. Therefore, an adverse effect of flicker noise (1/f noise) which is reduced as the frequency increases can be minimized. Moreover, since the number of circuit blocks provided in the preceding stage of the sensitivity adjustment circuit 80 is reduced in comparison with the case of providing the sensitivity adjustment circuit in the subsequent stage of the filter section 110, deterioration in SNR which occurs when the sensitivity adjustment circuit 80 amplifies noise generated by these circuit blocks can be minimized.

The sensitivity adjustment circuit 80 shown in FIG. 18 is an example of a non-inverting amplifier circuit. Note that an inverting amplifier circuit may be used as the sensitivity adjustment circuit 80.

In the sensitivity adjustment circuit 80, the resistance of a variable resistor RD2 between an output node ND3 and an output tap QT and the resistance of a variable resistor RD1 between the output tap QT and a node of the voltage AGND are variably controlled based on sensitivity adjustment data DPGA. This allows adjustment of the gain of the sensitivity adjustment circuit 80, whereby the sensitivity is adjusted. For example, when the resistances of the variable resistors RD1 and RD2 are respectively referred to as R1 and R2, the gain of the sensitivity adjustment circuit 80 (PGA) is G=(R1+R2)/R1.

The sensitivity adjustment circuit 80 shown in FIG. 18 operates as a programmable-gain amplifier and a high-pass filter. Specifically, a capacitor CD1, a resistor RD3, and an operational amplifier OPD form a high-pass active filter. Specifically, the operational amplifier OPD functions as a buffer for the high-pass filter formed of the capacitor CD1 and the resistor RD3. A programmable-gain amplifier is formed of the variable resistors RD1 and RD2 and the operational amplifier OPD. Specifically, the operational amplifier OPD is used in common by the high-pass active filter and the programmable-gain amplifier.

The DC component can be cut off by causing the sensitivity adjustment circuit 80 to operate as the high-pass filter, whereby a situation can be prevented in which the DC signal is amplified by the programmable-gain amplifier (PGA). Therefore, a problem can be prevented in which the programmable-gain amplifier of the sensitivity adjustment circuit 80 or the operational amplifier in the subsequent stage (e.g. operational amplifier of the synchronous detection circuit) is saturated due to overinput, whereby the output overflows. Moreover, DC noise can be removed by the high-pass filter, whereby the SNR can be increased.

In the sensitivity adjustment circuit 80, the operational amplifier OPD is used in common by the high-pass active filter and the programmable-gain amplifier. Therefore, the number of operational amplifiers can be reduced as compared with the case of separately providing an operational amplifier for the active filter and an operational amplifier for the programmable-gain amplifier. Therefore, the circuit scale can be reduced. Moreover, since the number of circuit blocks as the noise source can be reduced, the SNR can be increased.

In this embodiment, the sensitivity adjustment circuit 80 shown in FIG. 18 is formed of a first-type operational amplifier OP1. Specifically, the operational amplifier OPD of the sensitivity adjustment circuit 80 used in common by the high-pass filter and the programmable-gain amplifier is formed of a first-type operational amplifier OP1.

Specifically, the first-type operational amplifier OP1 mainly designed to reduce thermal noise is used as the operational amplifier OPD of the sensitivity adjustment circuit 80 which processes a signal in a high frequency band (driving-side resonance frequency band) in which thermal noise predominantly occurs. As a result, thermal noise of the sensitivity adjustment circuit 80 can be minimized, whereby the SNR of the entire system can be increased.

The synchronous detection circuit 100 performs synchronous detection based on the synchronization signal CLK from the driver circuit 40. The synchronous detection circuit 100 includes a switching element SE1 ON/OFF-controlled based on the synchronization signal CLK, and a switching element SE2 ON/OFF-controlled based on an inversion synchronization signal CLKN. The synchronous detection circuit 100 performs synchronous detection using a single balanced mixer method. A signal VS5 is input to the switching element SE1, and an inversion signal VS5N of the signal VS5 is input to the switching element SE2.

Figure 19:
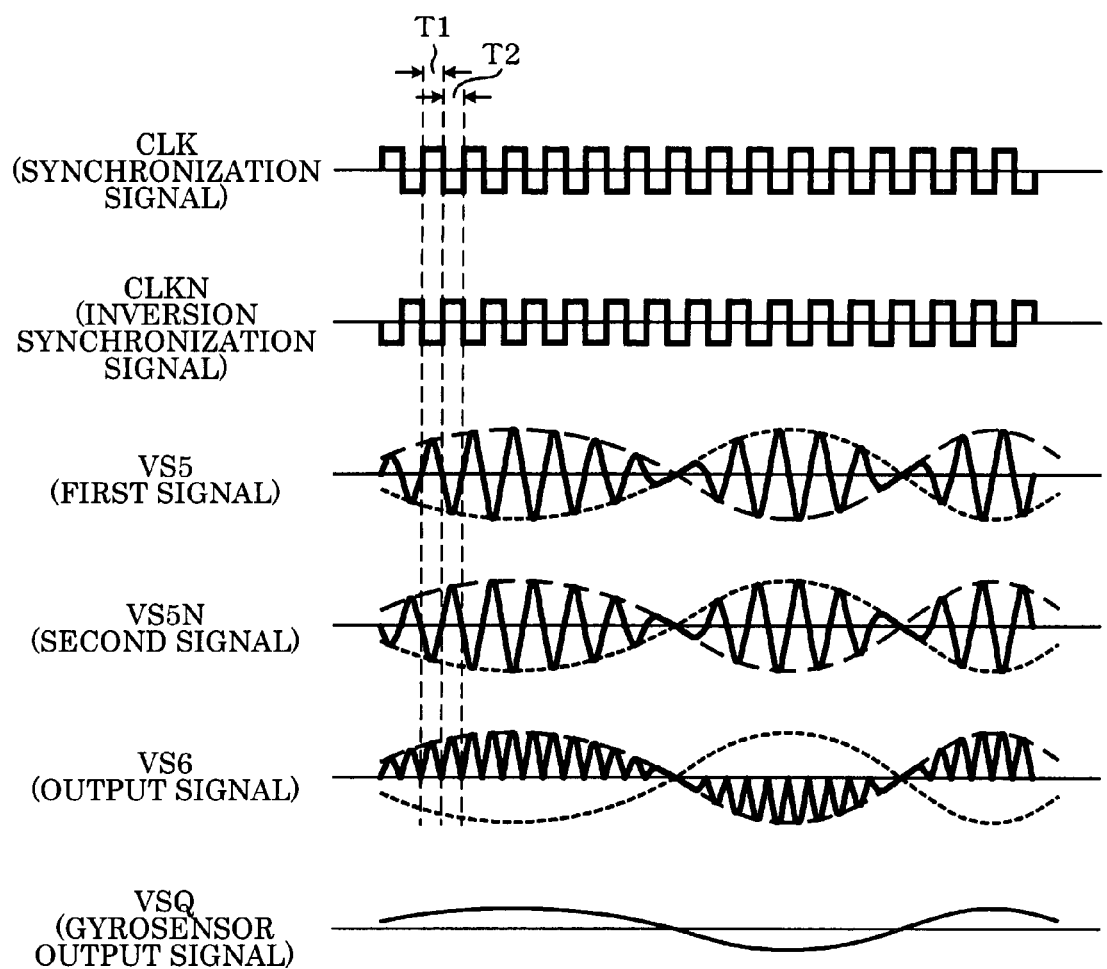
FIG. 19 shows a signal waveform example illustrative of synchronous detection.

FIG. 19 shows a signal waveform example illustrative of synchronous detection. As shown in FIG. 19, the input signal VS5 is output to the output terminal as the signal VS6 in a first period T1 in which the synchronization signal CLK is set at the H level, and the inversion signal VS5N of the input signal VS5 is output to the output terminal as the signal VS6 in a second period T2 in which the synchronization signal CLK is set at the L level. The gyrosensor output signal (desired signal) can be detected and extracted by synchronous detection. Note that the synchronous detection circuit 100 may utilize a double balanced mixer method.

In FIG. 18, the synchronous detection circuit 100 includes an offset adjustment circuit 90 (zero-point adjustment circuit). The offset adjustment circuit 90 removes an initial offset voltage (offset voltage) of the output signal VSQ of the detection device 30. For example, the offset adjustment circuit 90 performs an offset adjustment process so that the voltage of the output signal VSQ coincides with the reference output voltage at a typical temperature of 25° C.

The offset adjustment circuit 90 includes a D/A conversion circuit 92 and an adder circuit (adder-subtracter circuit) 94. The D/A conversion circuit 92 converts initial offset adjustment data DDA into an analog initial offset adjustment voltage VA.

The adder circuit 94 adds the adjustment voltage VA from the D/A conversion circuit 92 to the voltage of the input signal VS5. The adder circuit 94 includes resistors RE1, RE2, and RE3 respectively provided between a node NE5 and nodes NE6, NE1, and NE2. The adder circuit 94 also includes an operational amplifier OPE of which the inverting input terminal is connected with the node NE5 and the noninverting input terminal is connected with a node of the voltage AGND.

In this embodiment, the synchronous detection circuit 100 is formed of a third-type operational amplifier OP3 described with reference to FIGS. 5B, 5C, and 12. Specifically, the third-type operational amplifier OP3 is used as the operational amplifier OPE of the offset adjustment circuit 90 of the synchronous detection circuit 100.

For example, the synchronous detection circuit 100 functions as a mixer (frequency conversion circuit). Therefore, a low-frequency signal and a high-frequency signal exist in the synchronous detection circuit 100 in a mixed state. For example, the signals VS5 and VS5N are high-frequency AC signals, and the adjustment voltage VA of the offset adjustment circuit 90 is a DC signal. Therefore, the operational amplifier OPE of the synchronous detection circuit 100 processes a low-frequency signal and a high-frequency signal as the amplification target signals. Accordingly, thermal noise and flicker noise must be taken into consideration for the operational amplifier OPE.

In this embodiment, the third-type operational amplifier OP3 with low thermal noise and low flicker noise is used as the operational amplifier OPE. Therefore, even if a low-frequency signal and a high-frequency signal exist as the amplification target signals in a mixed state, a low-noise signal amplification can be realized, whereby the SNR of the entire system can be increased.

In FIG. 18, a modification may be made in which the offset adjustment circuit 90 is not provided in the synchronous detection circuit 100. In this case, the third-type operational amplifier OP3 may be used as an inverting amplifier for generating the inversion signal VS5N of the input signal VS5.

With regard to the unnecessary signals described with reference to FIGS. 17A to 17C, an unnecessary signal caused by the detuning frequency $\Delta f = |fd - fs|$ occurs when a signal having the detection-side resonance frequency fs is mixed into the gyrosensor detection signal and the resulting detection signal is synchronously detected by the synchronous detection circuit 100. For example, the detection vibrator may be allowed to vibrate (idle) with a small amplitude at the natural resonance frequency fs in order to improve the response of the gyrosensor. Or, the detection vibrator may vibrate at the natural resonance frequency fs when external vibration from the outside of the gyrosensor is applied to the vibrator. When the detection vibrator vibrates at the frequency fs, a signal having the frequency fs is mixed into the signal VS5 input to the synchronous detection circuit 100. Since the synchronous detection circuit 100 performs synchronous detection based on the synchronization signal CLK having the frequency fd, an unnecessary signal having the detuning frequency $\Delta f = |fd - fs|$ corresponding to the difference between the frequencies fd and fs is generated.

Figure 20:
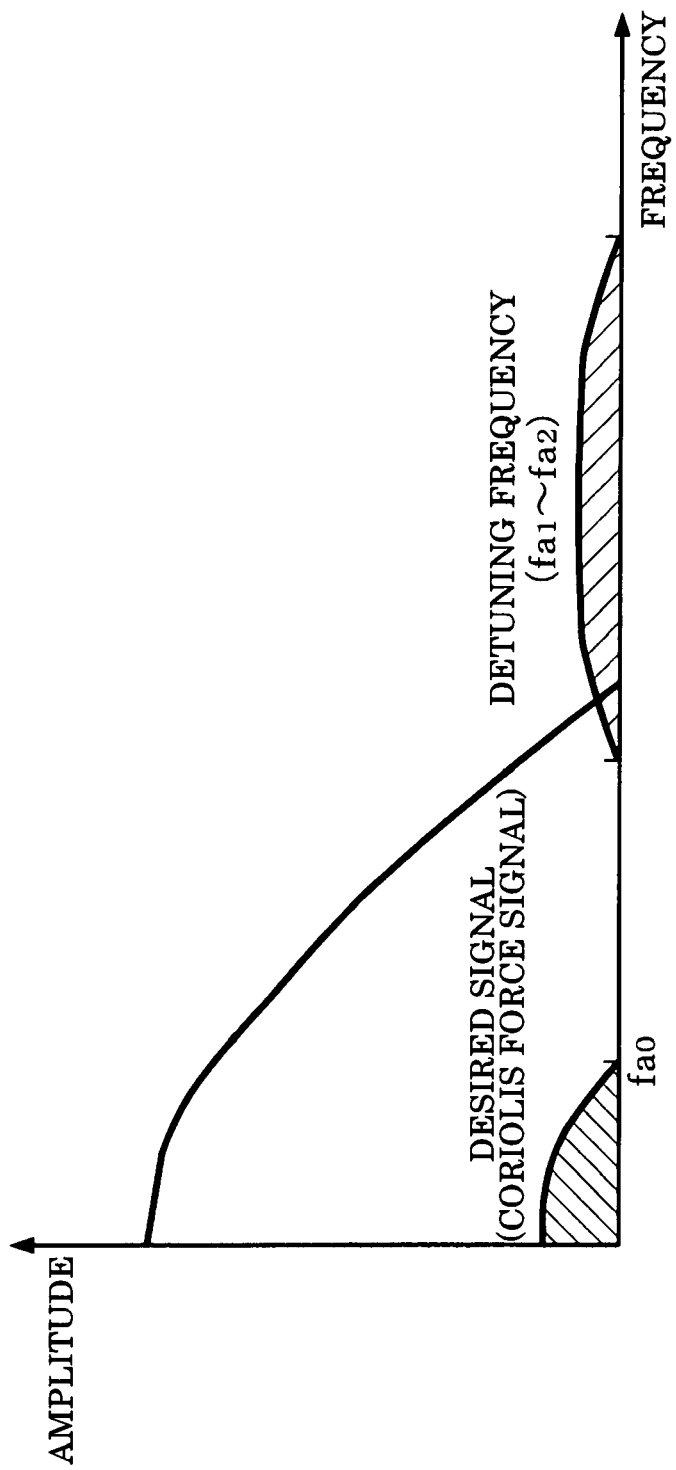
FIG. 20 is a view illustrative of a detuning frequency.

The detuning frequency $\Delta f = |fd - fs|$ is sufficiently lower than the frequencies fd and fs. Therefore, steep attenuation characteristics shown in FIG. 20 are necessary to remove the unnecessary signal of the component having the detuning frequency $\Delta f$. Therefore, it is difficult to remove the unnecessary signal of the component having the detuning frequency $\Delta f$ using only a continuous-time low-pass filter.

In order to solve the above problem, a switched-capacitor filter (SCF) 114 (discrete-time filter) is provided in the filter section 110 in FIG. 18. The SCF 114 has frequency characteristics of removing the component having the detuning frequency $\Delta f = |fd - fs|$ corresponding to the difference between the driving-side resonance frequency fd and the detection-side resonance frequency fs of the vibrator and allowing the frequency component (DC component) of the desired signal to pass through. The filter section 110 also includes a prefilter 112 provided in the preceding stage of the SCF 114, and an output circuit 116 which is provided in the subsequent stage of the SCF 114 and functions as an output buffer and a postfilter. The prefilter 112 and the output circuit 116 are continuous-time filters.

The steep attenuation characteristics shown in FIG. 20 are easily realized by providing the SCF 114 (discrete-time filter in a broad sense) in the filter section 110, as shown in FIG. 18. Therefore, even if the detuning frequency $\Delta f$ is extremely lower than the frequency fd, the component of the unnecessary signal in the frequency band of the detuning frequency $\Delta f$ can be reliably and easily removed without adversely affecting the desired signal in the pass band.

As shown in FIG. 18, the SCF 114 includes switched capacitor circuits 210, 212, and 214, capacitors CG4, CG5, CG6, and CG7, and operational amplifiers OPG1 and OPG2. The configuration of the SCF 114 is not limited to the configuration shown in FIG. 18. Various known configurations may be used.

When providing the SCF 114 in the filter section 110 as shown in FIG. 18, since the SCF 114 samples the signal in discrete time, aliasing occurs which is a frequency fold-over phenomenon caused by sampling.

In order to prevent an adverse effect of such aliasing, the anti-aliasing prefilter 112 (continuous-time filter in a broad sense) is provided in the preceding stage of the SCF 114 in FIG. 18. Specifically, when the sampling frequency is fsp (=fd), the prefilter 112 has anti-aliasing frequency characteristics of removing frequency components equal to or higher than the frequency fsp/2 (=fd/2).

In this case, the frequency band of the desired signal is fa0 or less (i.e., the frequency of the desired signal is low), as shown in FIG. 20, for example. On the other hand, the sampling frequency fsp of the SCF 114 is 50 to 500 times the frequency fa0 (i.e., the sampling frequency fsp is high), for example. Therefore, steep attenuation characteristics are unnecessary when using a normal anti-aliasing prefilter.

However, it was found that a sensor processing a weak signal such as a gyrosensor cannot remove an unnecessary signal utilizing normal anti-aliasing attenuation characteristics. Specifically, the amplitude of the unnecessary signal included in the gyrosensor detection signal is about 100 to 500 times the amplitude of the desired signal, for example. Therefore, the amplitude of the unnecessary signal becomes higher than the amplitude of the desired signal (DC component) when utilizing normal anti-aliasing attenuation characteristics, whereby the SNR deteriorates due to the effect on the DC component caused by sampling of the SCF 114, for example.

Therefore, the prefilter 112 (continuous-time filter) preferably has frequency characteristics (filtering characteristics or attenuation characteristics) of attenuating the amplitude of the unnecessary signal, which appears in the frequency band of the frequency k×fd (k is a positive integer) due to synchronous detection by the synchronous detection circuit 100, to a value equal to or smaller than the amplitude of the desired signal (minimum resolution). The amplitude of the desired signal corresponds to the minimum resolution of the desired signal, and corresponds to degrees per second (dps). The amplitude of the desired signal is the amplitude of the desired signal in the DC frequency region.

Therefore, even if the unnecessary signal having an amplitude about 100 to 500 times the amplitude of the desired signal appears at the frequency k×fd, the frequency component of the unnecessary signal can be reliably removed using the prefilter 112.

In this embodiment, the filter section 110 shown in FIG. 18 is formed of a second-type operational amplifier OP2 described with reference to FIGS. 5B, 5C, and 11B. Specifically, the second-type operational amplifiers OP2 are used as the operational amplifiers OPH, OPG1, OPG2, and OP1 of the filter section 110.

In FIG. 18, the SCF 114 with steep attenuation characteristics is used to remove the unnecessary signal due to the detuning frequency. The operational amplifiers OPG1 and OPG2 are necessary in order to realize the SCF 114.

In FIG. 18, the anti-aliasing prefilter 112 is also used as a filter which removes the unnecessary signal which appears at the frequency k×fd due to synchronous detection. Therefore, a second-order active low-pass filter is used as the prefilter 112, for example. The operational amplifier OPH is required for realizing the active low-pass filter.

In FIG. 18, the output circuit 116 functions as the output buffer which subjects the output signal VSQ to impedance conversion and also functions as the postfilter for the SCF 114. The operational amplifier OP1 is required for realizing the function of the output buffer and the function of the postfilter.

As described above, the operational amplifiers OPH, OPG1, OPG2, and OP1 are provided in the filter section 110, and the SNR of the entire system deteriorates to a large extent when these operational amplifier have a high noise level.

In this embodiment, the second-type operational amplifiers OP2 with low flicker noise are used as the operational amplifiers OPH, OPG1, OPG2, and OP1. As a result, even if these operational amplifiers are used, flicker noise of the filter section 110 can be minimized, whereby the SNR of the entire system can be increased.

In the second-type operational amplifier OP2, the bias current Ib flowing through the differential section is smaller than the bias current Ia flowing through the differential section of the first-type operational amplifier OP1 (Ib<Ia). Therefore, an increase in power consumption of the entire system can be minimized, even if the operational amplifiers OPH, OPG1, OPG2, and OP1 are provided in the filter section 110 as shown in FIG. 18.

5. Electronic Instrument

Figure 21:
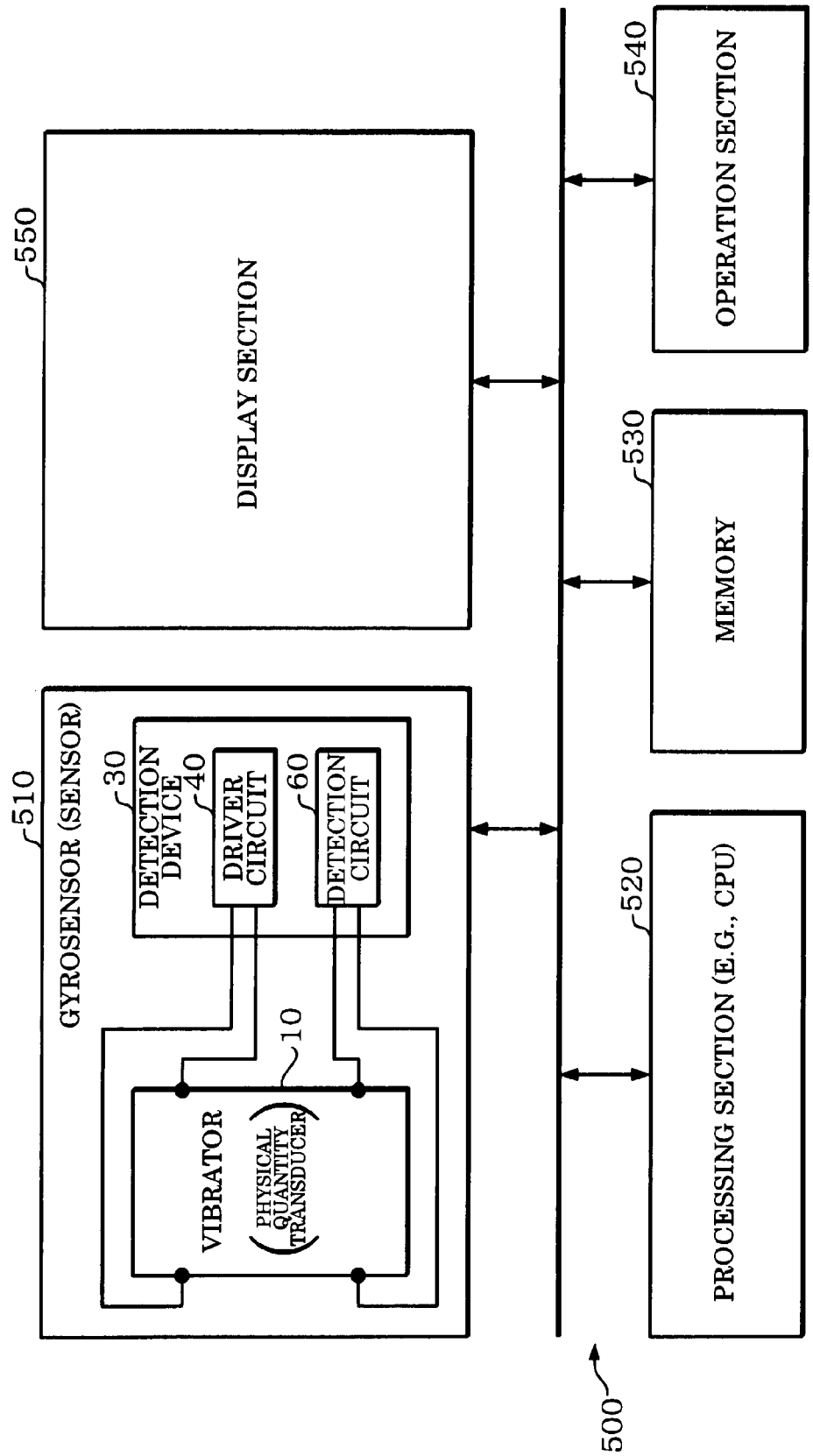
FIG. 21 shows a configuration example of an electronic instrument and a gyrosensor.

FIG. 21 shows a configuration example of a gyrosensor 510 (sensor in a broad sense) including the detection device 30 according to this embodiment, and an electronic instrument 500 including the gyrosensor 510. The electronic instrument 500 and the gyrosensor 510 are not limited to the configuration shown in FIG. 21. Various modification may be made such as omitting some elements or adding another element. As the electronic instrument 500 according to this embodiment, various electronic instruments such as a digital camera, a video camera, a portable telephone, a car navigation system, a robot, a game machine, and a personal digital assistant may be considered.

The electronic instrument 500 includes the gyrosensor 510 and a processing section 520. The electronic instrument 500 may also include a memory 530, an operation section 540, and a display section 550. The processing section (e.g., CPU or MPU) 520 controls the gyrosensor 510 and the like, and controls the entire electronic instrument 500. The processing section 520 performs processes based on information (angular velocity information or physical quantity) detected by the gyrosensor 510. For example, the processing section 520 performs processes for image blur correction, position control, GPS autonomous navigation, and the like based on the detected angular velocity information. The memory (e.g. ROM or RAM) 530 stores a control program and various types of data, and functions as a work area and a data storage area. The operation section 540 allows the user to operate the electronic instrument 500, and the display section 550 displays various types of information for the user. The detection device 30 according to this embodiment allows a small sensor to be employed as the gyrosensor 510 incorporated in the electronic instrument 500. This enables a reduction in size and cost of the electronic instrument 500.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. vibrator, gyrosensor, AGND, or SCF) cited with a different term (e.g. physical quantity transducer, sensor, analog reference voltage, or discrete-time filter) having a broader meaning or the same meaning at least once in the specification and the drawings can be replaced by the different term in any place in the specification and the drawings. The configurations of the analog circuit, the receiver device, the detection device, and the electronic instrument are not limited to those described in the above embodiments. Various modifications and variations may be made.

What is claimed is:

1. An analog circuit comprising:
    a first circuit including a first-type operational amplifier of which a frequency of an amplification target signal is a first frequency; and a second circuit including a second-type operational amplifier of which a frequency of an amplification target signal is a second frequency lower than the first frequency;

when a channel width and a channel length of a differential-stage transistor of a differential section of the first-type operational amplifier are respectively referred to as W1a and L1a, a bias current flowing through the differential section of the first-type operational amplifier is referred to as Ia, a channel width and a channel length of a differential-stage transistor of a differential section of the second-type operational amplifier are respectively referred to as W1b and L1b, and a bias current flowing through the differential section of the second-type operational amplifier is referred to as Ib, W1b×L1b>W1a×L1a and Ia>Ib being satisfied.

2. The analog circuit as defined in claim 1, when the first frequency is referred to as f1, the second frequency is referred to as f2, and a corner frequency of flicker noise and thermal noise in frequency-noise characteristics is referred to as fcr, the first-type operational amplifier satisfying f1−fcr<fcr−f2, and the second-type operational amplifier satisfying fcr−f2<f1−fcr.

3. The analog circuit as defined in claim 1, further comprising:

a mixer that mixes a signal with a specific frequency into a signal including a desired signal;

the first circuit being a circuit provided in a preceding stage of the mixer; and the second circuit being a circuit provided in a subsequent stage of the mixer.

4. The analog circuit as defined in claim 3, the first circuit being a first amplifier circuit that amplifies an input signal; and the first amplifier circuit including the first-type operational amplifier.

5. The analog circuit as defined in claim 3, the second circuit being a second amplifier circuit that amplifies the mixed signal from the mixer or a filter section that filters the mixed signal from the mixer; and the second amplifier circuit or the filter section including the second-type operational amplifier.

6. The analog circuit as defined in claim 1, when a channel length of an active-load-stage transistor of the differential section of the second-type operational amplifier is referred to as L3b, L1b<L3b being satisfied.

7. The analog circuit as defined in claim 1, when a WL ratio of the differential-stage transistor of the first-type operational amplifier is referred to as RT1a and a WL ratio of an active-load-stage transistor of the first-type operational amplifier is referred to as RT3a, RT1a>RT3a being satisfied.

8. The analog circuit as defined in claim 1, when an effective gate voltage of the differential-stage transistor of the second-type operational amplifier is referred to as Veff, a drain-source current is referred to as Ids, a mobility is referred to as μ, a gate capacitance per unit area is referred to as Cox, a WL ratio is referred to as RT1b, a Boltzmann constant is referred to as κ, an absolute temperature is referred to as T, an amount of electronic charge is referred to as q, and a process variation parameter is referred to as P (P>1), the WL ratio RT1b being set at a value satisfying the relationship P×(k×T/q)>Veff={2×Ids/(μ×Cox×RT1b)}$^{1/2}$>k×T/q.

9. The analog circuit as defined in claim 1, when the area of an arrangement region of a differential-stage transistor pair including the differential-stage transistor among elements forming the second-type operational amplifier is referred to as Sdf and the area of an arrangement region of the elements forming the second-type operational amplifier other than the differential-stage transistor pair is referred to as Sre, Sdf>Sre being satisfied.

10. The analog circuit as defined in claim 9, the differential-stage transistor of the second-type operational amplifier including J (J>2) transistors connected in parallel; and the J transistors connected in parallel being disposed in the arrangement region of the differential-stage transistor.

11. The analog circuit as defined in claim 10, the active-load-stage transistor of the second-type operational amplifier including I (J>I>2) transistors connected in parallel; and the J transistors forming the differential-stage transistor being arranged along a direction X, and the I transistors forming the active-load-stage transistor being arranged along the direction X on a direction Y side of the J transistors.

12. The analog circuit as defined in claim 3, the mixer including a third-type operational amplifier; and when a channel width and a channel length of a differential-stage transistor of a differential section of the third-type operational amplifier are respectively referred to as W1c and L1c and a bias current that flows through the differential section of the third-type operational amplifier is referred to as Ic, W1c×L1c>W1a×L1a and Ic>Ib being satisfied.

13. The analog circuit as defined in claim 1, further comprising:

a reference voltage supply circuit that supplies an analog reference voltage;

the reference voltage supply circuit including:

a first supply circuit that includes a reference-voltage first-type operational amplifier and supplies the analog reference voltage to the first circuit; and a second supply circuit that includes a reference-voltage second-type operational amplifier and supplies the analog reference voltage to the second circuit; and when a channel width and a channel length of a differential-stage transistor of a differential section of the reference-voltage first-type operational amplifier are respectively referred to as W1d and L1d, a bias current flowing through the differential section of the reference-voltage first-type operational amplifier is referred to as Id, a channel width and a channel length of a differential-stage transistor of a differential section of the reference-voltage second-type operational amplifier are respectively referred to as Wie and Lie, and a bias current flowing through the differential section of the reference-voltage second-type operational is referred to as Ie, W1e×L1e>W1d ×L1d and Id>Ie being satisfied.

14. The analog circuit as defined in claim 1, the first frequency being a frequency of a carrier signal, and the second frequency being a frequency of a desired signal carried by the carrier signal.

15. An electronic instrument comprising:

the analog circuit as defined in claim 1; and a processing section that performs processes based on information from the analog circuit.

16. An electronic instrument comprising:

the analog circuit as defined in claim 2; and a processing section that performs processes based on information from the analog circuit.

17. An electronic instrument comprising:
the analog circuit as defined in claim 3; and
a processing section that performs processes based on information from the analog circuit.

18. An electronic instrument comprising:
the analog circuit as defined in claim 8; and
a processing section that performs processes based on information from the analog circuit.

19. An electronic instrument comprising:
the analog circuit as defined in claim 9; and
a processing section that performs processes based on information from the analog circuit.

20. An operational amplifier comprising:
a differential section; and
an output section connected with an output node of the differential section;
the differential section including a differential-stage transistor pair and an active-load-stage transistor pair; and
when the area of an arrangement region of the differential-stage transistor pair among elements forming the operational amplifier is referred to as Sdf, the area of an arrangement region of the elements forming the operational amplifier other than the differential-stage transistor pair is referred to as Sre, a channel length of a differential-stage transistor of the differential-stage transistor pair is referred to as L1, an effective gate voltage of the differential-stage transistor is referred to as Veff, a drain-source current is referred to as Ids, a mobility is referred to as μ, a gate capacitance per unit area is referred to as Cox, a WL ratio is referred to as RT1, a channel length of a active-load-stage transistor of the active-load-stage transistor pair is referred to as L3, a Boltzmann constant is referred to as k, an absolute temperature is referred to as T, an amount of electronic charge is referred to as q, and a process variation parameter is referred to as P (P>1), Sdf>Sre and L1<L3 being satisfied and the WL ratio RT1 being set at a value satisfying the relationship $$P \times (k \times T/q) > V\text{eff} = \{2 \times \text{Ids}/(\mu \times \text{Cox} \times RT1)\}^{1/2} > k \times T/q.$$

* * * * *

UNITED STATES PATENT AND TRADEMARK OFFICE
CERTIFICATE OF CORRECTION

PATENT NO. : 7,619,474 B2  Page 1 of 1
APPLICATION NO. : 11/979820
DATED : November 17, 2009
INVENTOR(S) : Akihiro Fukuzawa It is certified that error appears in the above-identified patent and that said Letters Patent is hereby corrected as shown below:

On the Title Page

Item (12) should read:

United States Patent
~~Fukukaza~~ Fukuzawa

Item (75) should read:

Inventor:    Akihiro ~~Fukukaza~~Fukuzawa, Hino (JP)

Signed and Sealed this

Sixteenth Day of March, 2010

David J. Kappos
*Director of the United States Patent and Trademark Office*